United States Patent
Hirano et al.

(10) Patent No.: US 12,376,446 B2
(45) Date of Patent: Jul. 29, 2025

(54) PHOTOELECTRIC CONVERSION ELEMENT AND IMAGING DEVICE

(71) Applicants: SONY GROUP CORPORATION, Tokyo (JP); SONY SEMICONDUCTOR SOLUTIONS CORPORATION, Kanagawa (JP)

(72) Inventors: Yoshiyuki Hirano, Kanagawa (JP); Yuta Hasegawa, Kanagawa (JP); Osamu Enoki, Kanagawa (JP); Iwao Yagi, Kanagawa (JP); Yosuke Saito, Tokyo (JP); Masami Senoh, Kanagawa (JP)

(73) Assignees: SONY GROUP CORPORATION, Tokyo (JP); SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 686 days.

(21) Appl. No.: 17/773,326

(22) PCT Filed: Oct. 20, 2020

(86) PCT No.: PCT/JP2020/039330
§ 371 (c)(1),
(2) Date: Apr. 29, 2022

(87) PCT Pub. No.: WO2021/085227
PCT Pub. Date: May 6, 2021

(65) Prior Publication Data
US 2022/0407019 A1 Dec. 22, 2022

(30) Foreign Application Priority Data
Nov. 1, 2019 (JP) .................. 2019-200097

(51) Int. Cl.
H10K 39/32 (2023.01)
H10K 30/30 (2023.01)
H10K 85/60 (2023.01)

(52) U.S. Cl.
CPC ............ *H10K 39/32* (2023.02); *H10K 30/30* (2023.02); *H10K 85/6576* (2023.02)

(58) Field of Classification Search
CPC ..................... H10K 39/32; H10K 85/6576
See application file for complete search history.

(56) References Cited

U.S. PATENT DOCUMENTS

| | | | |
|---|---|---|---|
| 2016/0133865 A1 | 5/2016 | Yamaguchi | |
| 2016/0181547 A1* | 6/2016 | Han | C07D 471/06 257/40 |
| 2019/0081251 A1 | 3/2019 | Obana et al. | |
| 2019/0214591 A1 | 7/2019 | Park et al. | |
| 2020/0365807 A1* | 11/2020 | Shibuya | H10K 85/624 |

FOREIGN PATENT DOCUMENTS

| | | |
|---|---|---|
| CN | 102790180 A | 11/2012 |
| CN | 109983579 A | 7/2019 |

(Continued)

OTHER PUBLICATIONS

Tatsuya Yamamoto, Kazuo Takimiya; Facile Synthesis of Highly π-Extended Heteroarenes, Dinaphtho[2,3-b:2',3'-f]chalcogenopheno[3,2-b]chalcogenophenes, and Their Application to Field-Effect Transistors. J. Am. Chem. Soc. 2007, 129, 8, 2224-2225. (Year: 2007).*

(Continued)

*Primary Examiner* — Daniel P Shook
(74) *Attorney, Agent, or Firm* — K&L Gates LLP

(57) ABSTRACT

A photoelectric conversion element 10A according to an embodiment of the present disclosure includes: a first electrode 21; a second electrode 23 that is disposed to be opposed to the first electrode 21; and a photoelectric conversion layer 22 that is provided between the first electrode (Continued)

21 and the second electrode 23. The photoelectric conversion layer 22 includes a hole transporting material as a first organic semiconductor material. The hole transporting material absorbs blue light.

17 Claims, 16 Drawing Sheets

(56) References Cited

FOREIGN PATENT DOCUMENTS

| JP | 2015050331 A |   | 3/2015 |
|----|--------------|---|--------|
| JP | 2016119471 A |   | 6/2016 |
| JP | 2018026559 A | * | 2/2018 |
| TW | 201105634 A |   | 2/2011 |
| WO | 2017159684 A1 |   | 9/2017 |
| WO | WO-2018173754 A1 |   | 9/2018 |
| WO | 2019053967 A1 |   | 3/2019 |

OTHER PUBLICATIONS

International Search Report from corresponding PCT application PCT/JP2020/039330, dated Dec. 28, 2020.
Hori, Yosuke et al., "Improvement of Quantum Efficiency in Blue Sensitive Organic Photoconductive Film", lecture preprints of the Japan Society of Applied Physics Spring meeting, vol. 64, Mar. 1, 2017, Lecture No. 17a-P4-21, in particular, fig. 1-2.

* cited by examiner

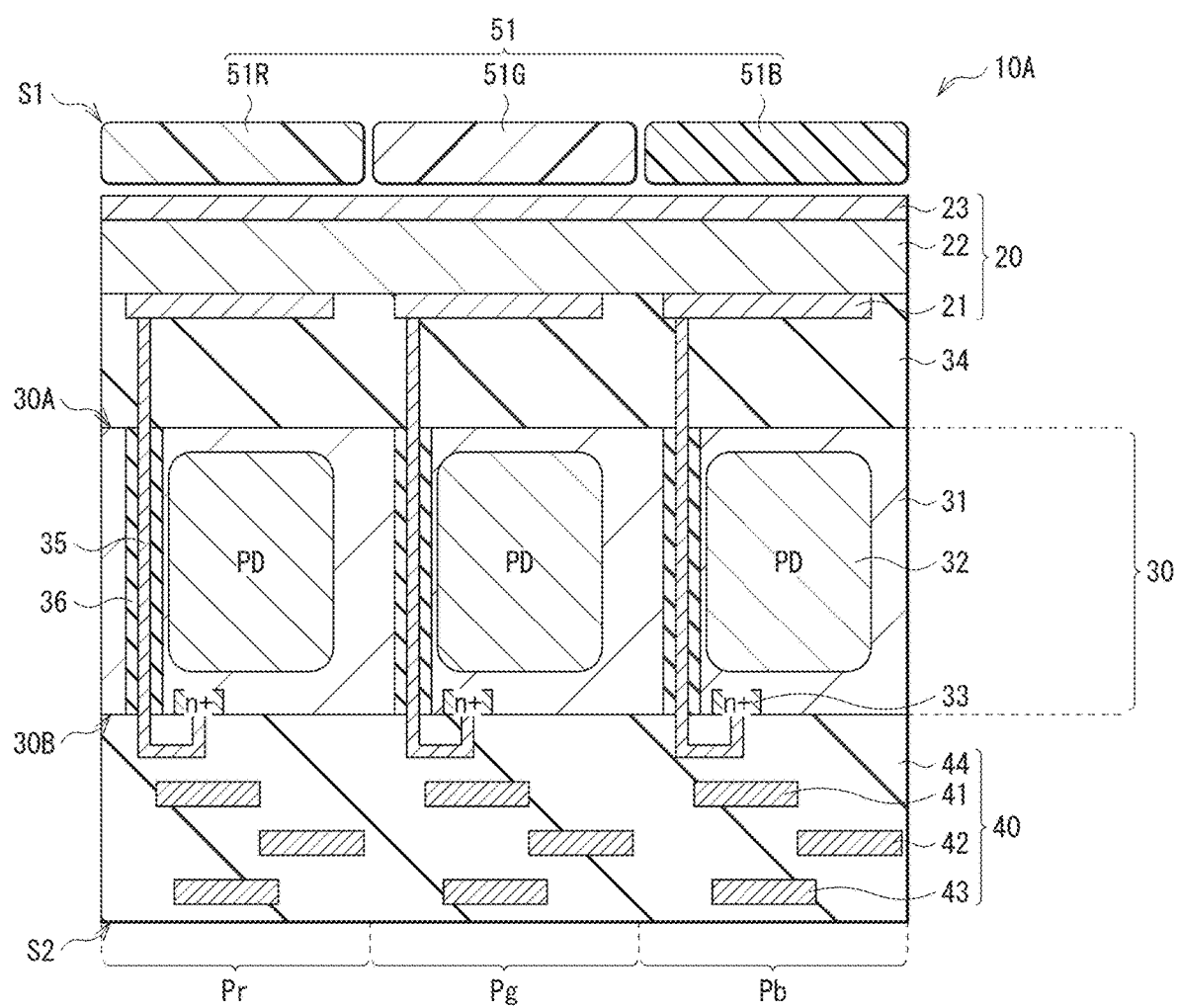
[FIG. 1]

[FIG. 2]
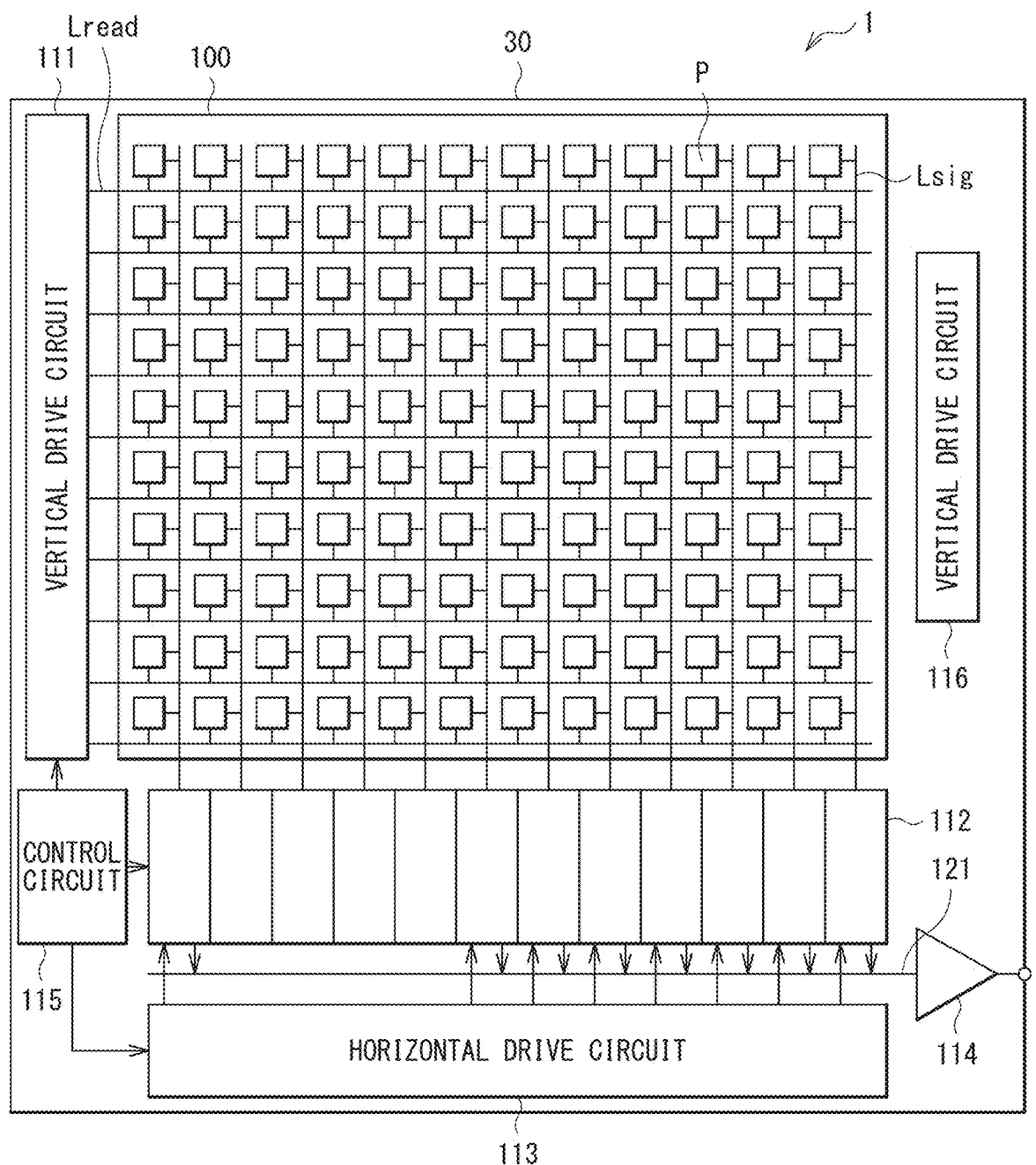

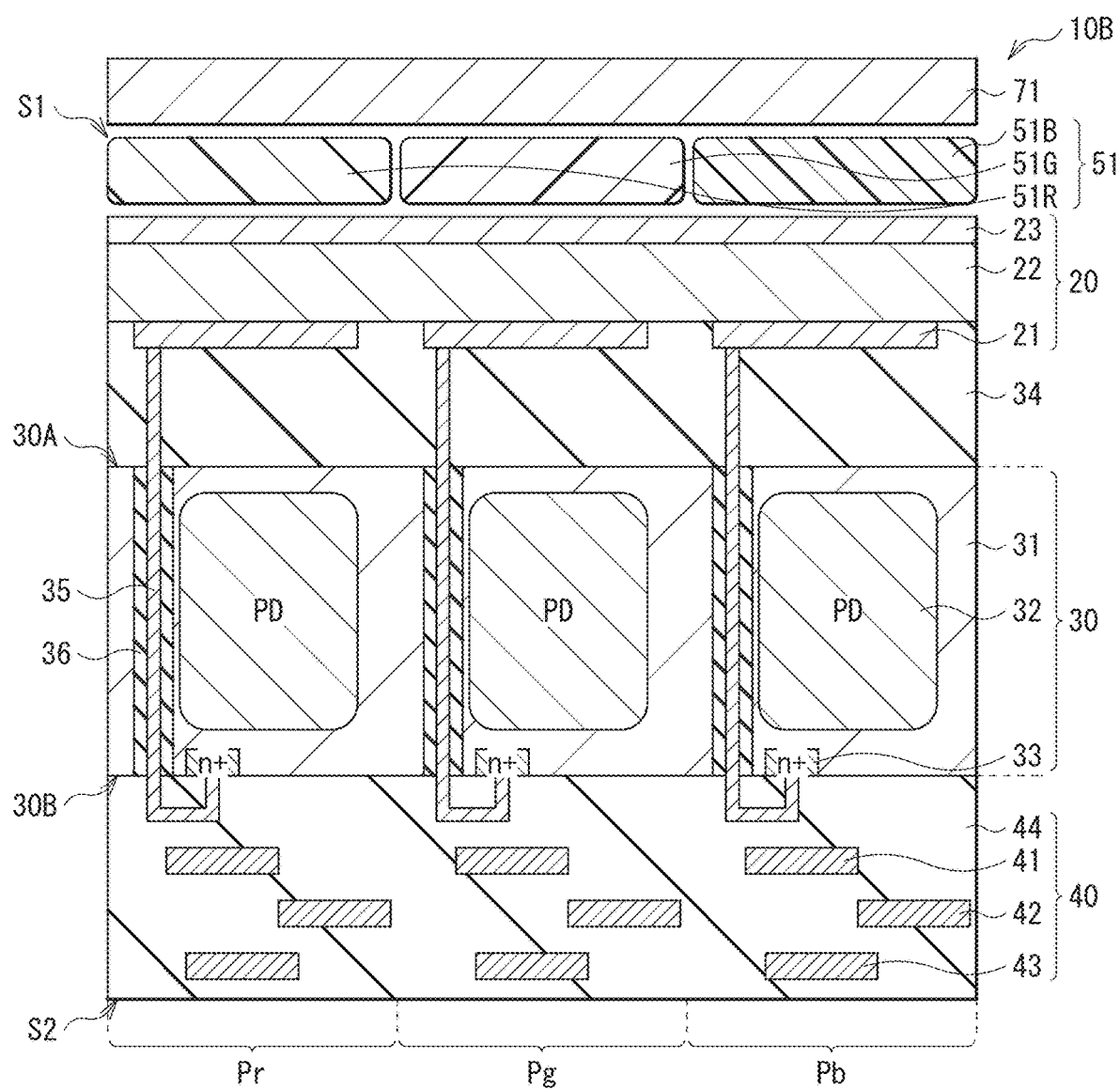
[FIG. 3]

[FIG. 4]
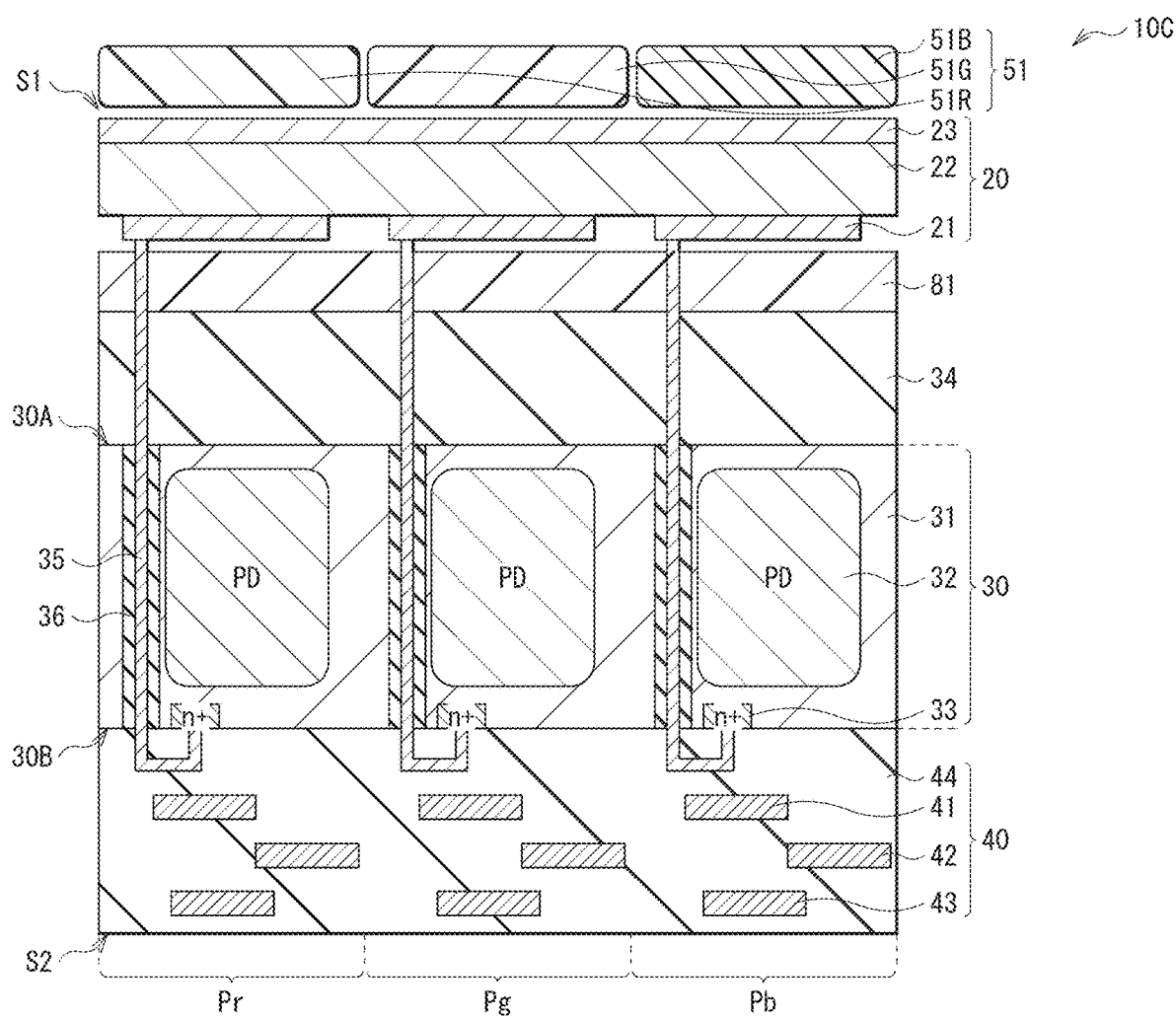

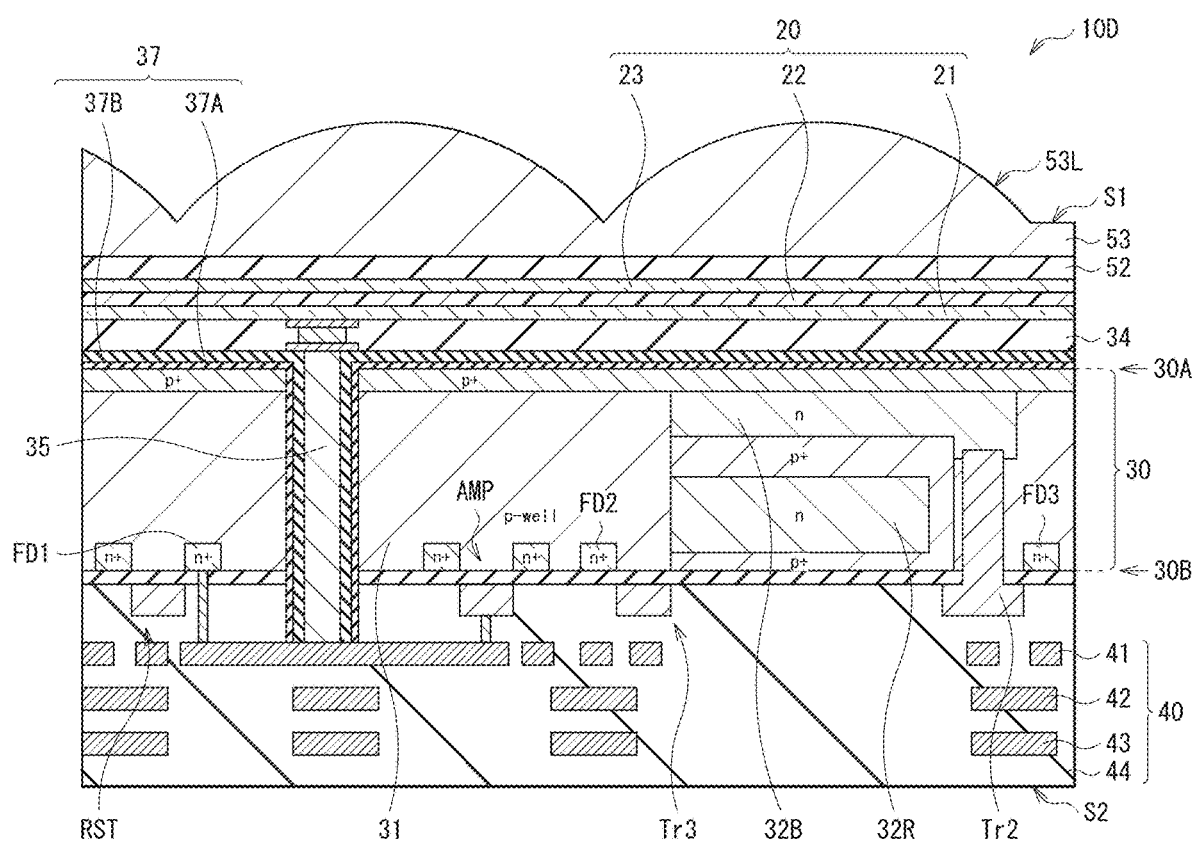

[FIG. 6]
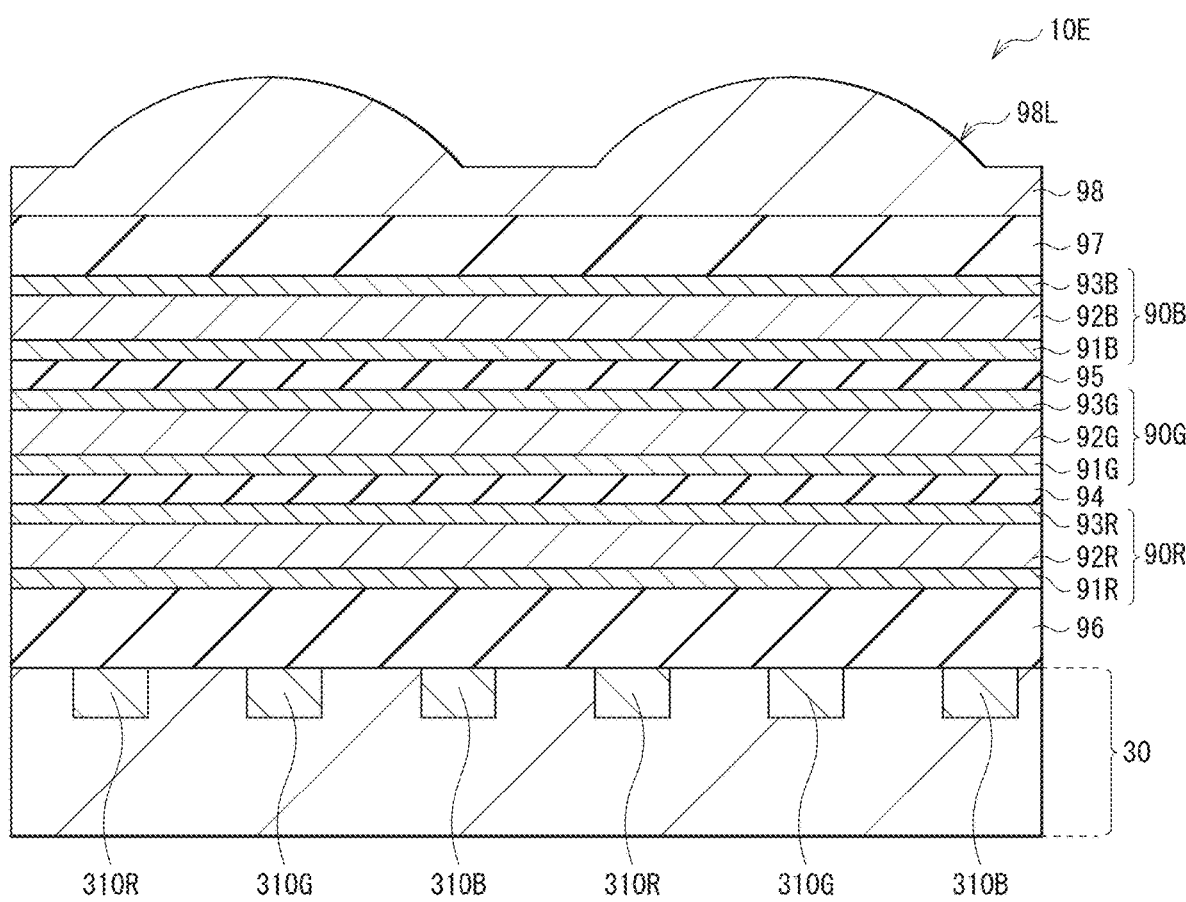

[ FIG. 7 ]
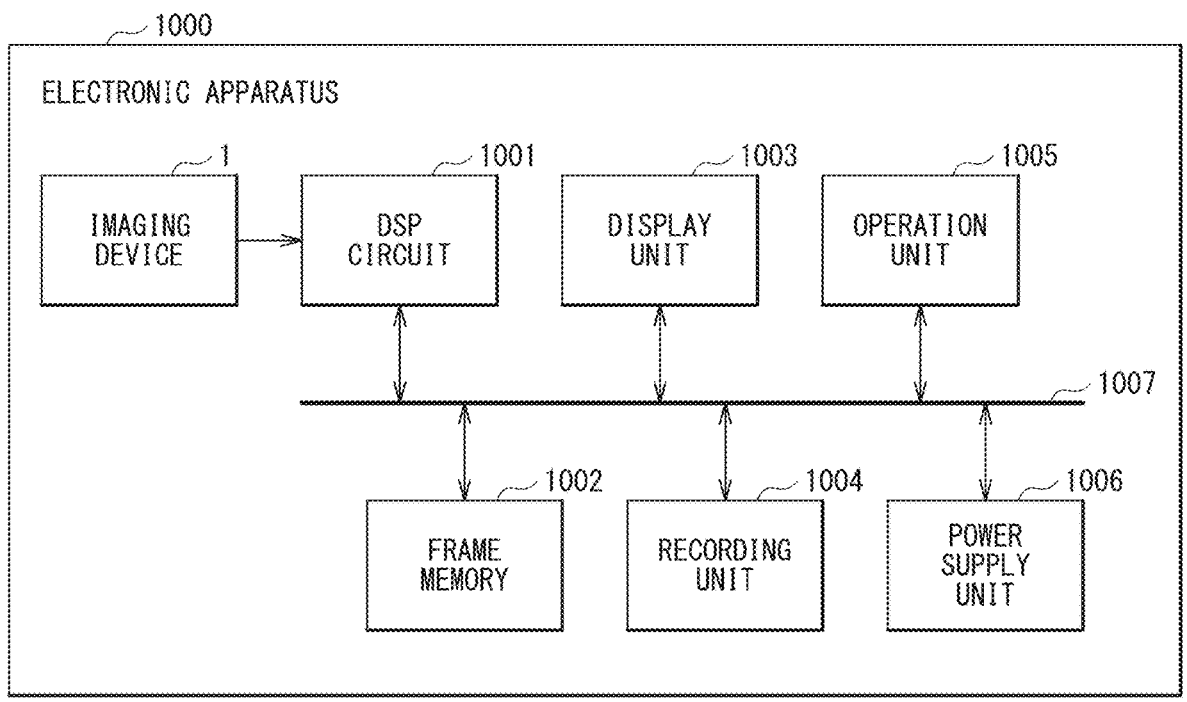

[FIG. 8]
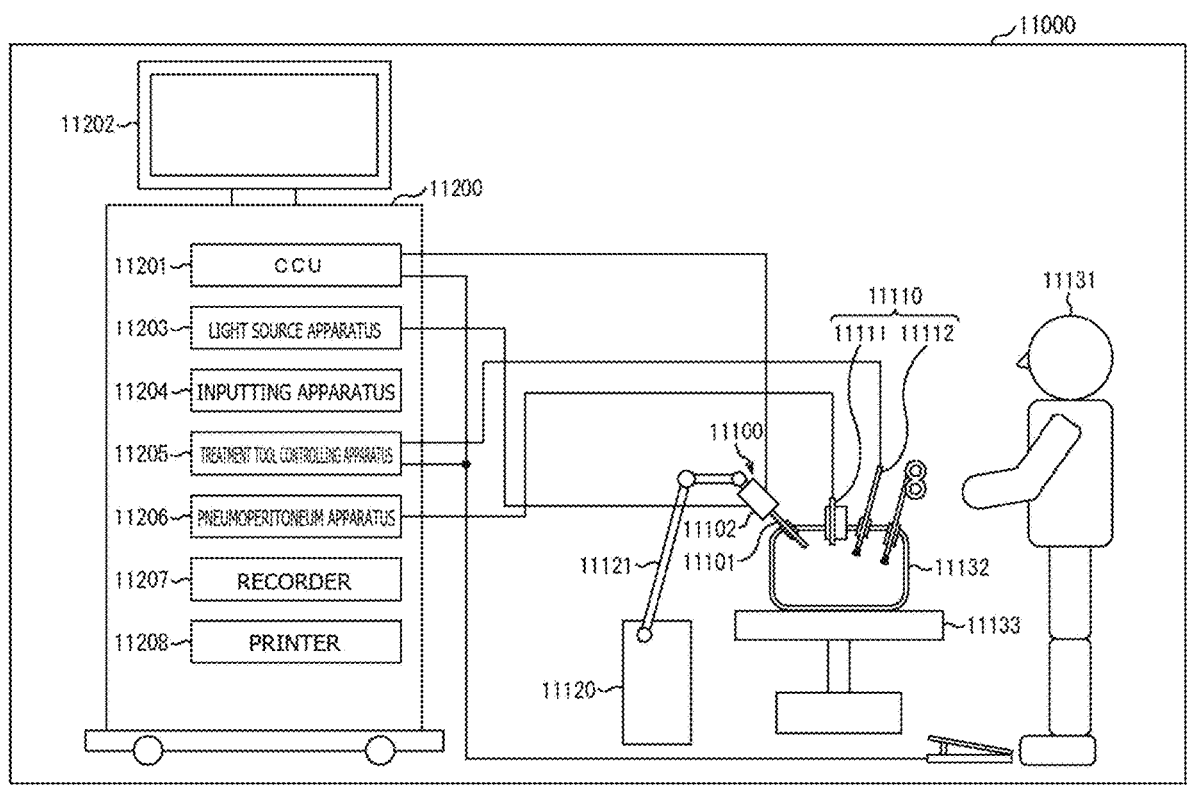

[FIG. 9]
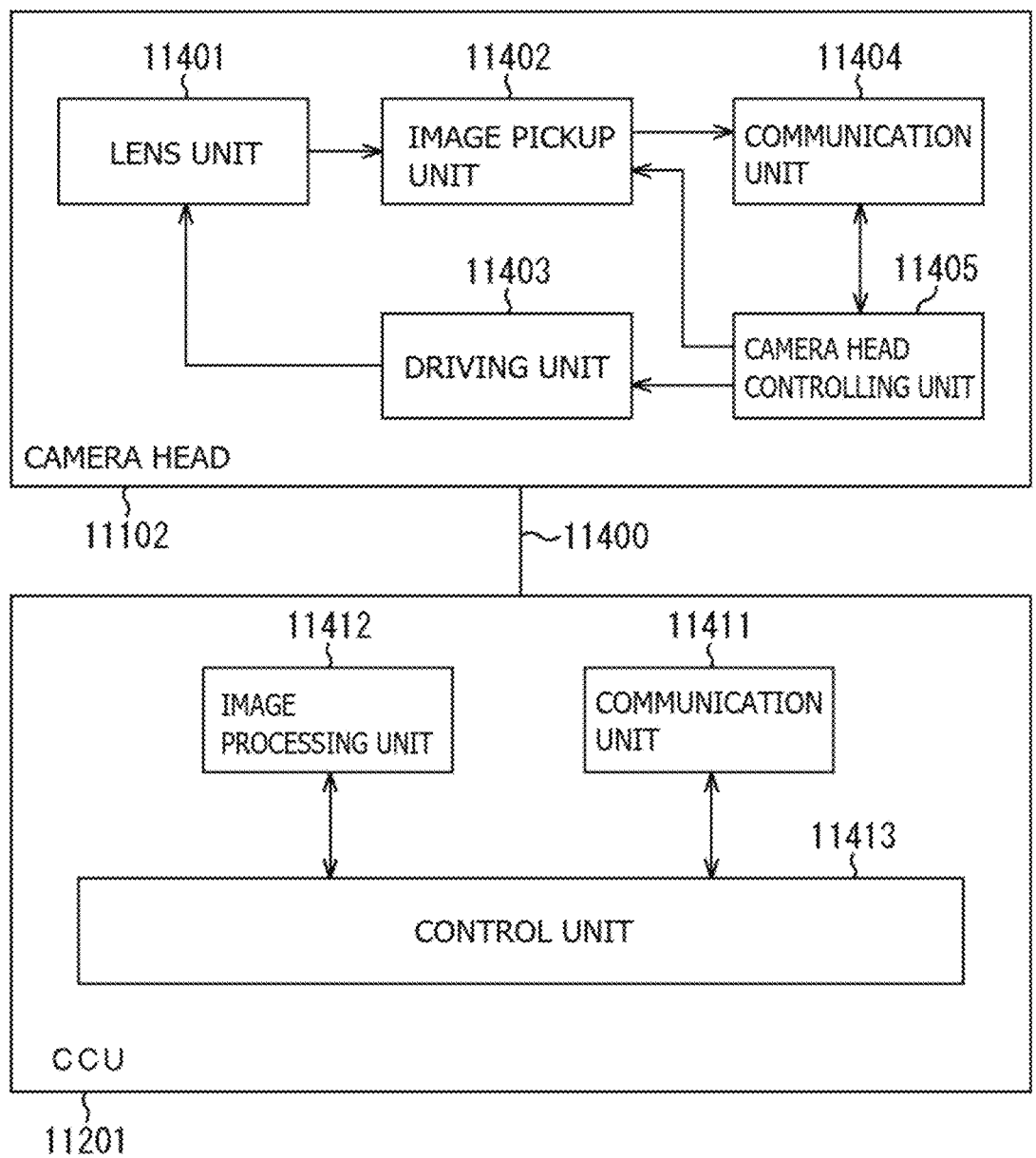

[ FIG. 10 ]
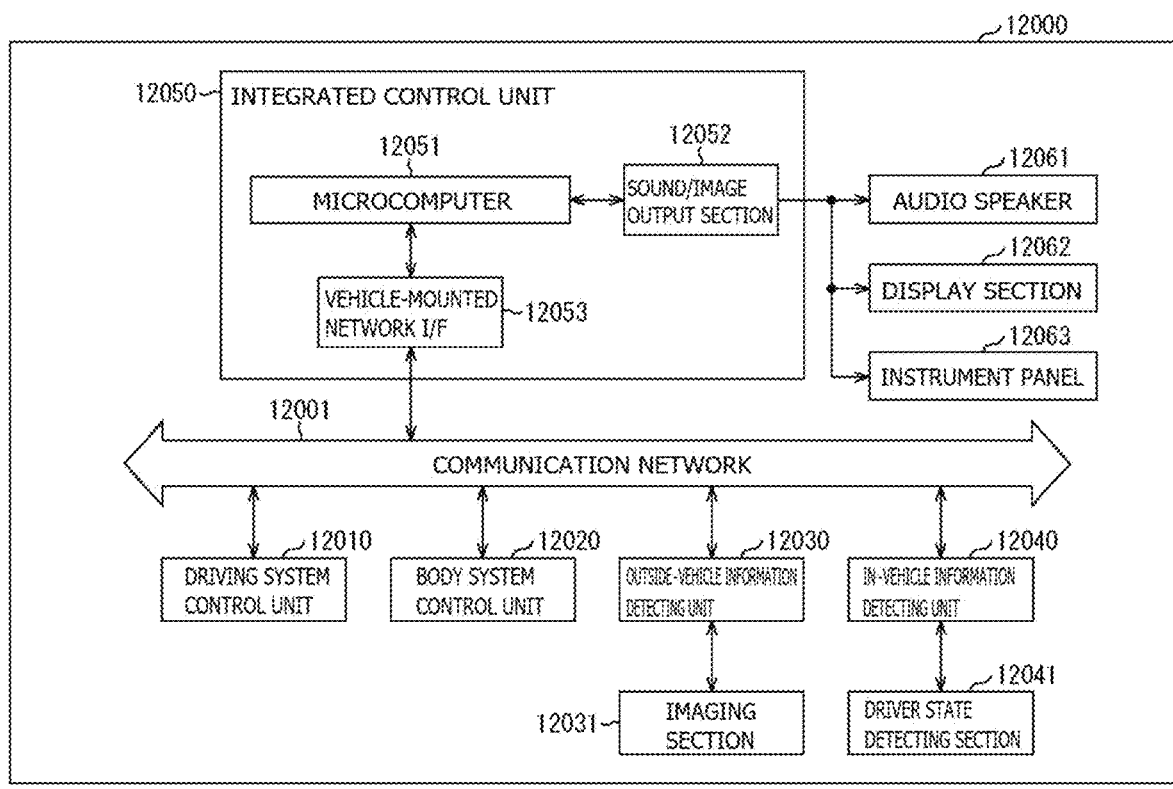

[FIG. 11]
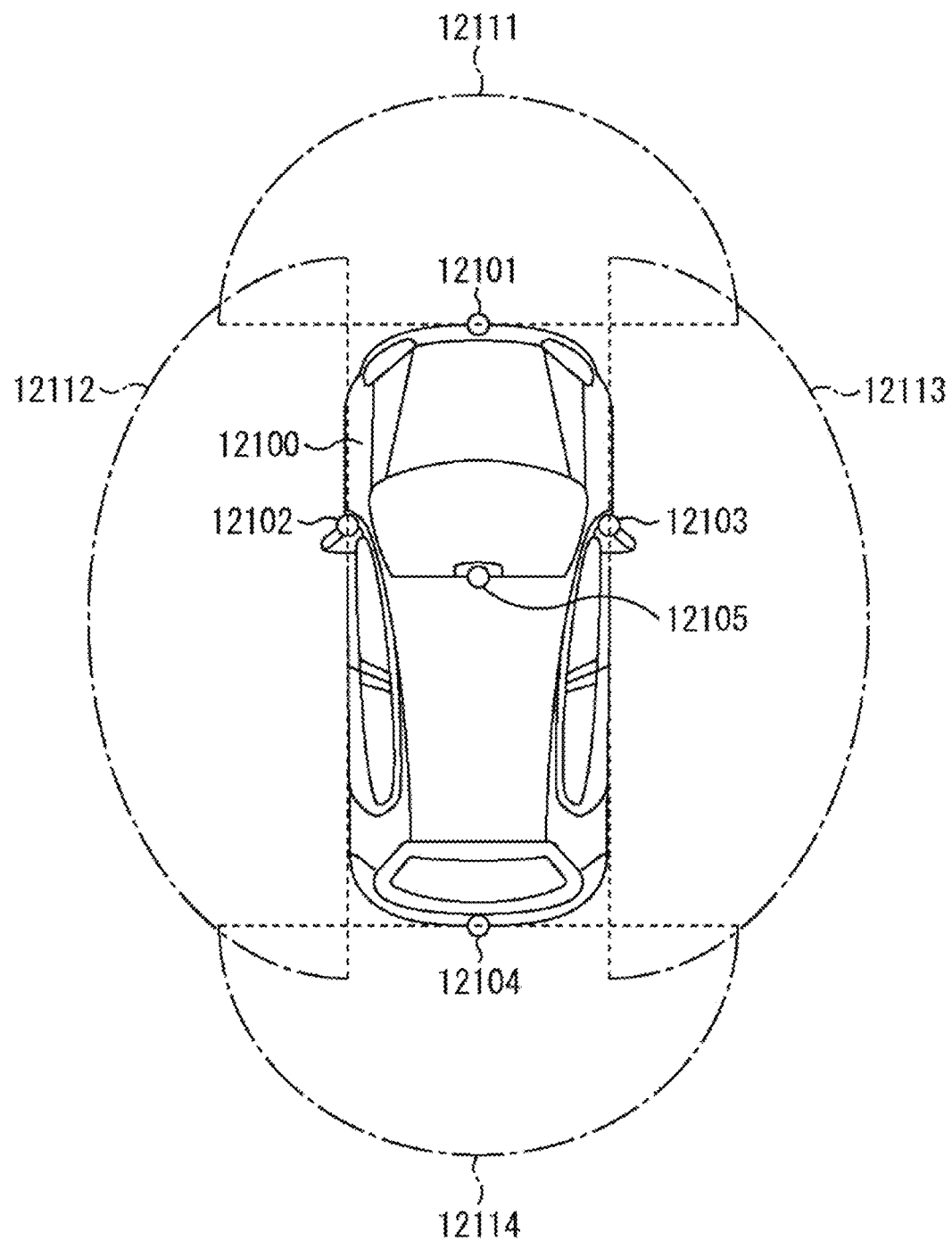

[FIG. 12]
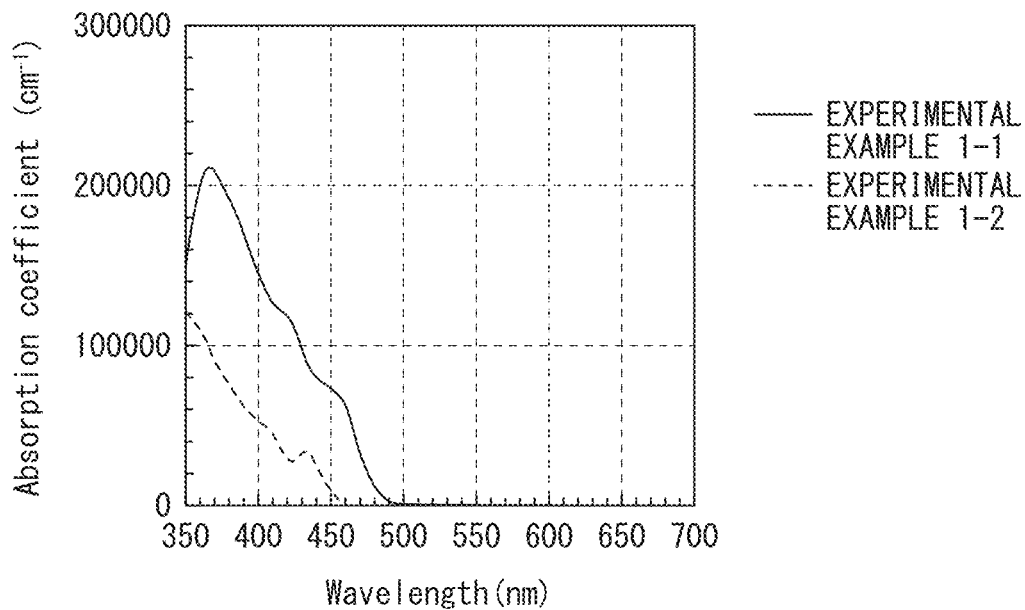
[FIG. 13]
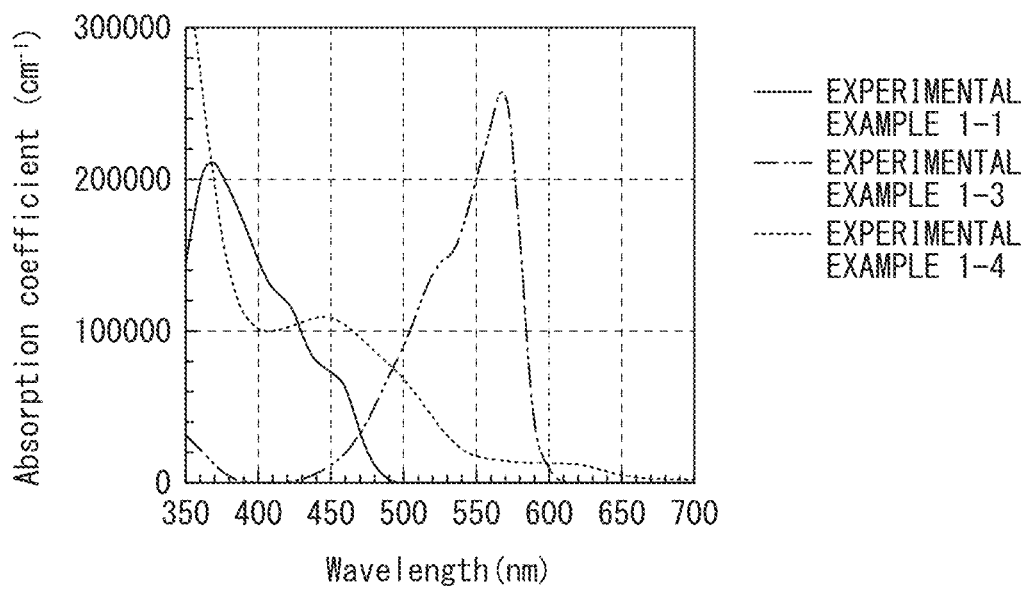

[ FIG. 14 ]
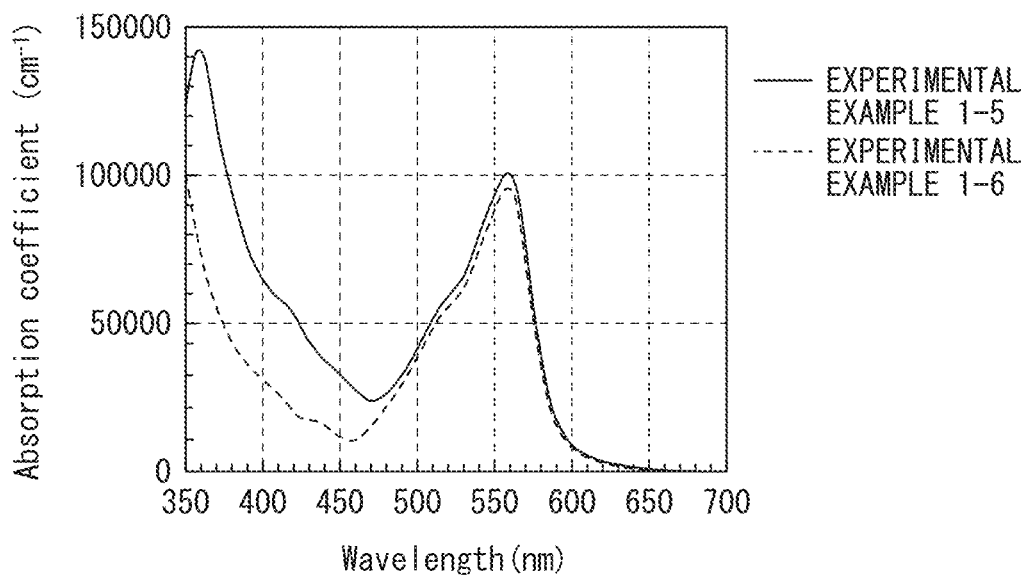
[ FIG. 15 ]
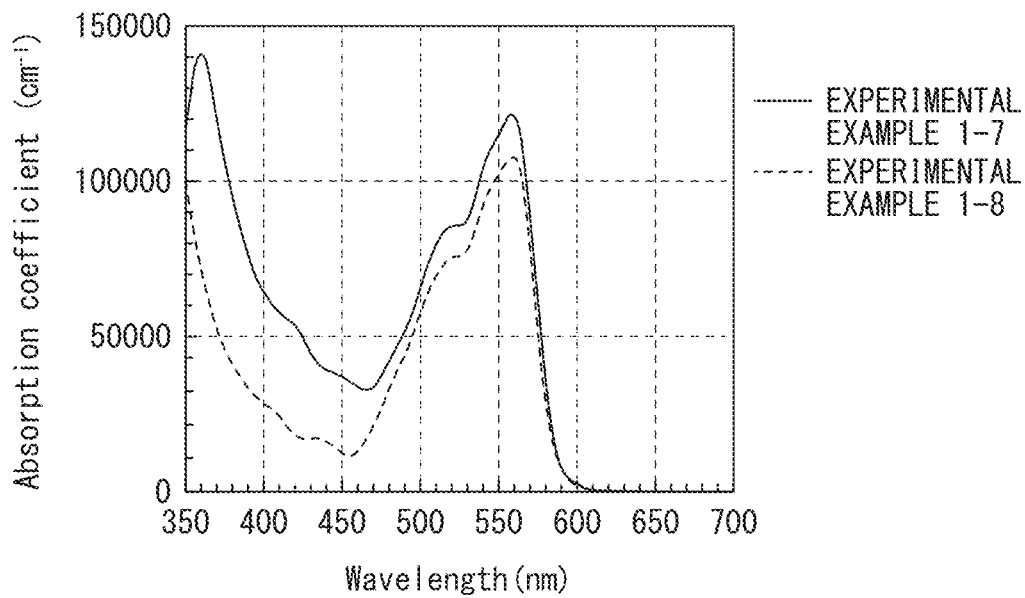

[ FIG. 16 ]
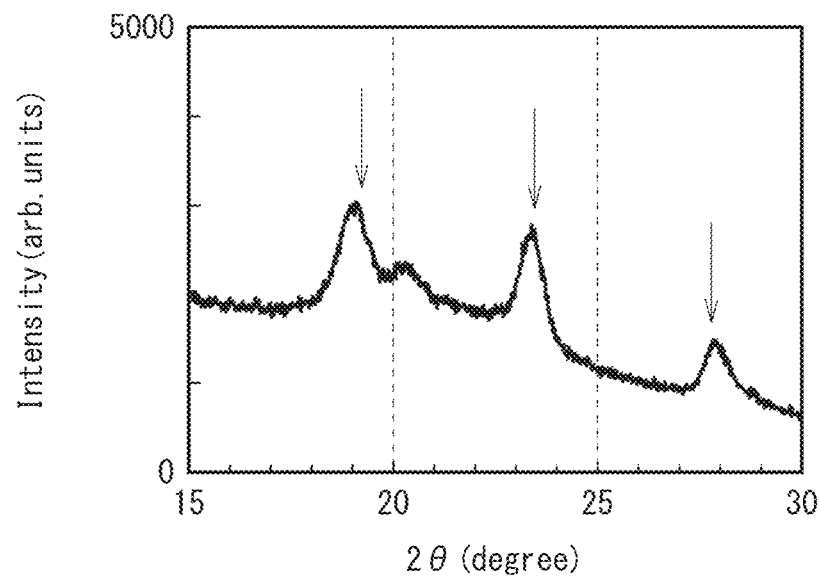
[ FIG. 17 ]
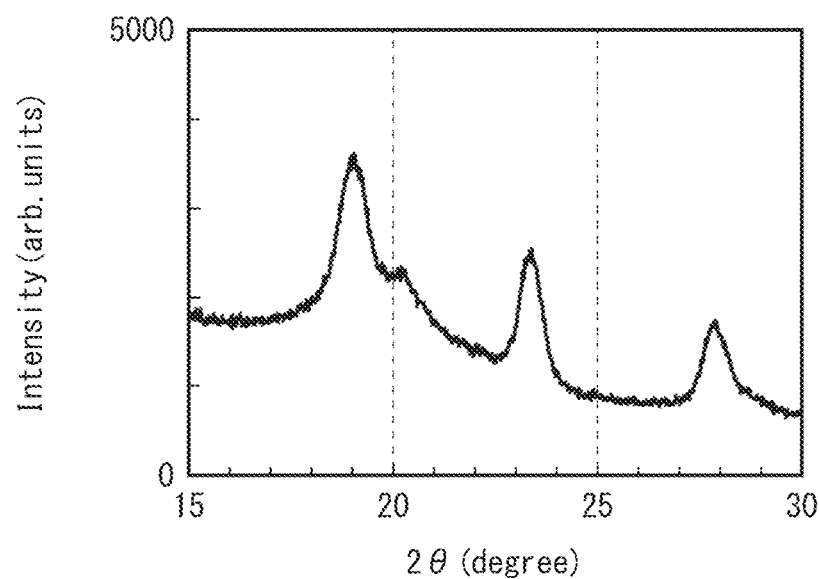

[ FIG. 18 ]
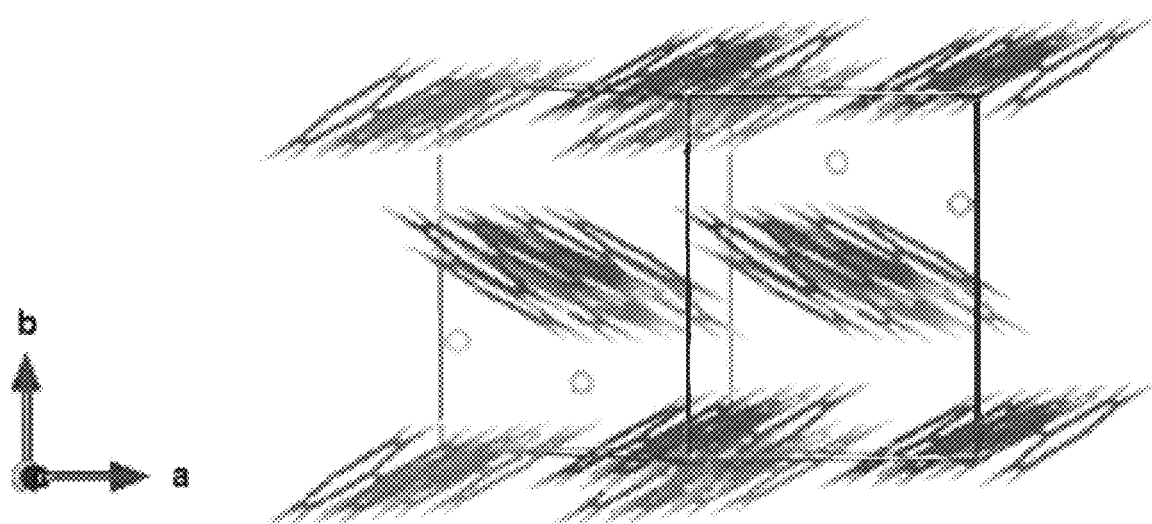

[ FIG. 19 ]
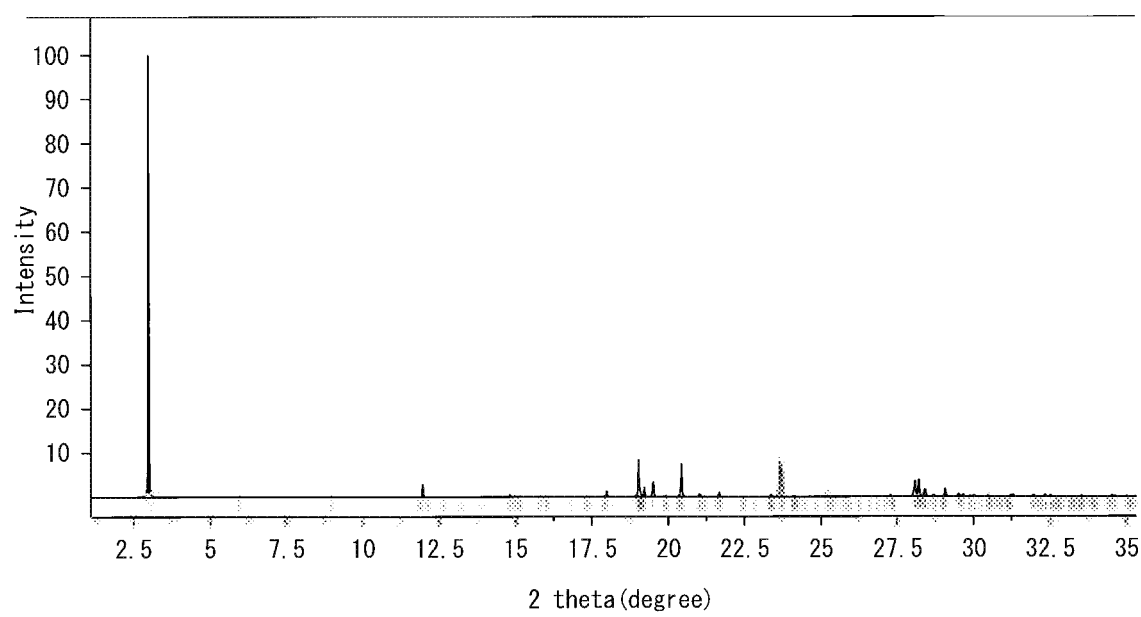

PHOTOELECTRIC CONVERSION ELEMENT AND IMAGING DEVICE

TECHNICAL FIELD

The present disclosure relates to a photoelectric conversion element in which, for example, an organic material is used and an imaging device including the photoelectric conversion element.

BACKGROUND ART

For example, PTL 1 discloses a photoelectric conversion element in which a photoelectric conversion layer is formed by using three types of materials. In this photoelectric conversion element, an organic semiconductor material that has the maximum absorption in a predetermined wavelength range is used as one of the three types of materials and organic semiconductor materials each having high transparency in the visible light region are used as the two other materials. This allows the photoelectric conversion element to achieve high photoelectric conversion efficiency for the predetermined wavelength range.

CITATION LIST

Patent Literature

PTL 1: International Publication No. WO 2017/159684

SUMMARY OF THE INVENTION

Incidentally, an imaging device has been required to have an extended absorption spectrum.

It is desirable to provide a photoelectric conversion element and an imaging device each having a wide absorption spectrum.

A photoelectric conversion element according to an embodiment of the present disclosure includes: a first electrode; a second electrode that is disposed to be opposed to the first electrode; and a photoelectric conversion layer that is provided between the first electrode and the second electrode. The photoelectric conversion layer includes a hole transporting material as a first organic semiconductor material. The hole transporting material absorbs blue light.

An imaging device according to an embodiment of the present disclosure includes the one or more photoelectric conversion elements according to the embodiment of the present disclosure described above for each of a plurality of pixels.

In the photoelectric conversion element according to the embodiment of the present disclosure and the imaging device according to the embodiment, the hole transporting material that absorbs the blue light is used for the photoelectric conversion layer as the first organic semiconductor material, thereby extending the absorption spectrum of the photoelectric conversion layer.

BRIEF DESCRIPTION OF DRAWING

FIG. 1 is a cross-sectional schematic diagram illustrating an example of a schematic configuration of a photoelectric conversion element according to an embodiment of the present disclosure.

FIG. 2 is a block diagram illustrating a configuration of an imaging device including the photoelectric conversion element illustrated in FIG. 1.

FIG. 3 is a cross-sectional schematic diagram illustrating an example of a schematic configuration of a photoelectric conversion element according to a modification example 1 of the present disclosure.

FIG. 4 is a cross-sectional schematic diagram illustrating another example of the schematic configuration of the photoelectric conversion element according to the modification example 1 of the present disclosure.

FIG. 5 is a cross-sectional schematic diagram illustrating an example of a schematic configuration of a photoelectric conversion element according to a modification example 2 of the present disclosure.

FIG. 6 is a cross-sectional schematic diagram illustrating an example of a schematic configuration of a photoelectric conversion element according to a modification example 3 of the present disclosure.

FIG. 7 is a block diagram illustrating a configuration example of an electronic apparatus including the imaging device illustrated in FIG. 2.

FIG. 8 is a view depicting an example of a schematic configuration of an endoscopic surgery system.

FIG. 9 is a block diagram depicting an example of a functional configuration of a camera head and a camera control unit (CCU).

FIG. 10 is a block diagram depicting an example of schematic configuration of a vehicle control system.

FIG. 11 is a diagram of assistance in explaining an example of installation positions of an outside-vehicle information detecting section and an imaging section.

FIG. 12 is an absorption spectrum diagram of a compound represented by a formula (1-1) and a compound represented by a formula (5).

FIG. 13 is an absorption spectrum diagram of three types of compounds that form the organic photoelectric conversion layer.

FIG. 14 is an absorption spectrum diagram of a ternary organic photoelectric conversion layer including the compound represented by the formula (1-1) or the compound represented by the formula (5).

FIG. 15 is an absorption spectrum diagram of a binary organic photoelectric conversion layer including the compound represented by the formula (1-1) or the compound represented by the formula (5).

FIG. 16 is an X-ray diffraction pattern of a thin film including the compound represented by the formula (1-1).

FIG. 17 is an X-ray diffraction pattern of a ternary organic photoelectric conversion layer including the compound represented by the formula (1-1).

FIG. 18 is a diagram illustrating a crystal structure of the compound represented by the formula (1-1).

FIG. 19 is a diffraction pattern of the compound represented by the formula (1-1).

MODES FOR CARRYING OUT THE INVENTION

The following describes an embodiment of the present disclosure in detail with reference to the drawings. The following description is a specific example of the present disclosure, but the present disclosure is not limited to the following modes. In addition, the present disclosure is not also limited to the disposition, dimensions, dimension ratios, and the like of the respective components illustrated in the respective diagrams. It is to be noted that description is given in the following order.

1. Embodiment (an example of a photoelectric conversion element including an organic photoelectric conversion layer including a hole transporting material that absorbs blue light)
1-1. Configuration of Photoelectric Conversion Element
1-2. Configuration of Imaging Device
1-3. Workings and Effects
2. Modification Examples
2-1. Modification Example 1 (an example in which a spectrum adjustment layer is added)
2-2. Modification Example 2 (an example in which an organic photoelectric conversion section that detects blue light and an inorganic photoelectric conversion section that detects red light and green light are stacked)
2-3. Modification Example 3 (an example in which organic photoelectric conversion layers each having different spectral characteristics are stacked)
3. Application Examples
4. Practical Application Examples
5. Working Examples 1. Embodiment FIG. 1 illustrates an example of a cross-sectional configuration of a photoelectric conversion element (photoelectric conversion element 10A) according to an embodiment of the present disclosure. FIG. 2 illustrates an example of an overall configuration of an imaging device (imaging device 1) including the photoelectric conversion element 10A illustrated in FIG. 1. The photoelectric conversion element 10A is included, for example, in one pixel (unit pixel P) in the imaging device 1 such as a CMOS (Complementary Metal Oxide Semiconductor) image sensor used, for example, for an electronic apparatus such as a digital still camera or a video camera. The photoelectric conversion element 10A according to the present embodiment includes an organic photoelectric conversion section 20. An organic photoelectric conversion layer 22 included in this organic photoelectric conversion section 20 is formed by using a hole transporting material that absorbs blue light.

1-1. Configuration of Photoelectric Conversion Element

The photoelectric conversion element 10A includes, for example, the one organic photoelectric conversion section 20. The organic photoelectric conversion section 20 includes the organic photoelectric conversion layer 22 between a lower electrode 21 (first electrode) and an upper electrode 23 (second electrode) that are disposed to be opposed to each other. The organic photoelectric conversion layer 22 is formed by using the organic semiconductor material described above as an organic material. The organic photoelectric conversion section 20 detects a portion or the whole of the wavelength of the visible light region (e.g., 400 nm or more and 760 nm or less).

In the present embodiment, there are provided color filters 51 (color filters 51R. 51G, and 51B) above the organic photoelectric conversion section 20 (light incidence side) for the respective unit pixels P (unit pixels Pr, Pg, and Pb). The color filters 51 (color filters 51R, 51G, and 51B) selectively transmit red light (R), green light (G), and blue light (B). This causes the organic photoelectric conversion section 20 to detect the red light passing through the color filter 51R in the unit pixel Pr provided with the color filter 51R and generate the signal charge corresponding to the red light (R). The organic photoelectric conversion section 20 detects the green light passing through the color filter 51G in the unit pixel Pg provided with the color filter 51G and generates the signal charge corresponding to the green light (G). The organic photoelectric conversion section 20 detects the blue light passing through the color filter 51B in the unit pixel Pb provided with the color filter 51B and generates the signal charge corresponding to the blue light (B).

The photoelectric conversion element 10A further includes, for example, one inorganic photoelectric conversion section 32. The inorganic photoelectric conversion section 32 is formed to be buried in a semiconductor substrate 30. The inorganic photoelectric conversion section 32 detects light in a wavelength range different from that of the organic photoelectric conversion section 20 and performs photoelectric conversion. In other words, the organic photoelectric conversion section 20 and the inorganic photoelectric conversion section 32 each detect light in a different wavelength range and perform photoelectric conversion. Specifically, the organic photoelectric conversion section 20 detects the wavelength of the visible light region and the inorganic photoelectric conversion section 32 detects the wavelength of the infrared light region (e.g., 700 nm or more and 1000 nm or less).

The organic photoelectric conversion section 20 and the inorganic photoelectric conversion section 32 are stacked, for example, in the vertical direction. Specifically, the organic photoelectric conversion section 20 is disposed, for example, on a light incidence side S1 side and provided, for example, on a first surface 30A (back surface) side of the semiconductor substrate 30.

This causes the pieces (R, G, and B) of light in the visible light region among the pieces of light passing through the respective color filters 51R, 51G, and 51B to be each absorbed by the organic photoelectric conversion section 20. The other light passes through the organic photoelectric conversion section 20. Specifically, light in the infrared light region passes through the organic photoelectric conversion section 20. This light (that is referred to simply as infrared light (IR) below) in the infrared light region that has passed through the organic photoelectric conversion section 20 is detected by the inorganic photoelectric conversion section 32 of each of the unit pixels Pr, Pg, and Pb. Each of the unit pixels Pr, Pg, and Pb generates the signal charge corresponding to the infrared light (IR). In other words, the imaging device 1 including the photoelectric conversion element 10A is able to concurrently generate both a visible light image and an infrared light image.

It is to be noted that, in the present embodiment, a case is described where the electron of a pair (electron-hole pair) of an electron and a hole generated by photoelectric conversion is read out as signal charge (case where an n-type semiconductor region is used as a photoelectric conversion layer). In addition, "+(plus)" attached to "n" indicates a high concentration of n-type impurities in a diagram.

A second surface 30B (front surface) of the semiconductor substrate 30 is provided, for example, with an electric charge holding section 33 and a pixel transistor and a multilayer wiring layer 40 that are not illustrated. In the multilayer wiring layer 40, for example, wiring layers 41, 42, and 43 are stacked in an insulating layer 44.

It is to be noted that the diagram illustrates the back surface (first surface 30A) side of the semiconductor substrate 30 as the light incidence side S1 and the front surface (second surface 30B) side thereof as a wiring layer side S2.

The organic photoelectric conversion section 20 has a configuration in which the lower electrode 21, the organic photoelectric conversion layer 22, and the upper electrode 23 are stacked in this order from the first surface 30A side of the semiconductor substrate 30 as described above. The lower electrodes 21 are separately formed, for example, for the respective photoelectric conversion elements 10A. FIG. 1 illustrates an example in which the organic photoelectric conversion layer 22 and the upper electrode 23 are provided as continuous layers common between the respective unit pixels Pr, Pg, and Pb, but the organic photoelectric conversion layers 22 and the upper electrodes 23 may also be separately formed for the respective unit pixels Pr. Pg, and Pb as with the lower electrodes 21.

There is provided, for example, an interlayer insulating layer 34 between the first surface 30A of the semiconductor substrate 30 and the organic photoelectric conversion section 20. For example, the color filter 51 is provided above the upper electrode 23 as described above. Although not illustrated, there are provided, for example, optical members such as a planarization layer and an on-chip lens above the color filter 51.

There is provided, for example, a through electrode 35 between the first surface 30A of the semiconductor substrate 30 and the second surface 30B. The lower electrode 21 is electrically coupled to the electric charge holding section 33 through the through electrode 35. In other words, the through electrode 35 has a function of a connector for the organic photoelectric conversion section 20 and the electric charge holding section 33 and also serves as a transmission path for the signal charge generated in the organic photoelectric conversion section 20. This allows the photoelectric conversion element 10A to favorably transfer the signal charge (electrons here) generated by the organic photoelectric conversion section 20 on the first surface 30A side of the semiconductor substrate 30 to the second surface 30B side of the semiconductor substrate 30 through the through electrode 35 and increase the characteristics. There is provided, for example, an insulating film 36 around the through electrode 35. This electrically insulates the through electrode 35 and a p-well 31.

In the organic photoelectric conversion section 20 according to the present embodiment, light coming from the upper electrode 23 side is absorbed by the organic photoelectric conversion layer 22. The excitons generated by this move to the interface between an electron donor and an electron acceptor included in the organic photoelectric conversion layer 22 and undergo exciton separation. In other words, the excitons dissociate into electrons and holes. The electric charge (electrons and holes) generated here is transported to different electrodes by diffusion due to a carrier concentration difference and an internal electric field caused by a work function difference between the anode (upper electrode 23 here) and the cathode (lower electrode 21 here). The transported electric charge is detected as a photocurrent. In addition, the application of a potential between the lower electrode 21 and the upper electrode 23 makes it possible to control the transport directions of electrons and holes.

The following describes configurations, materials, and the like of the respective sections.

The organic photoelectric conversion section 20 is an organic photoelectric conversion element that absorbs the light corresponding to the wavelength range of a portion or the whole of the visible light region to generate an electron-hole pair.

The lower electrode 21 is for attracting, as signal charge, electrons of the electric charge generated in the organic photoelectric conversion layer 22 and transferring the attracted signal charge to the electric charge holding section 33. The lower electrode 21 includes an electrically conductive film having light transmissivity. The lower electrode 21 includes, for example, ITO (indium tin oxide). However, a tin oxide ($SnO_2$)-based material to which a dopant is added or a zinc oxide-based material obtained by adding a dopant to zinc oxide (ZnO) may be used in addition to this ITO as a material included in the lower electrode 21. Examples of the zinc oxide-based material include aluminum zinc oxide (AZO) to which aluminum (Al) is added as a dopant, gallium zinc oxide (GZO) to which gallium (Ga) is added, and indium zinc oxide (IZO) to which indium (In) is added. In addition, CuI, $InSbO_4$, ZnMgO, $CuInO_2$, $MgIN_2O_4$, CdO, $ZnSnO_3$, $TiO_2$, or the like may be used as a material included in the lower electrode 21. Further, spinel oxide or oxide having a $YbFe_2O_4$ structure may be used.

The organic photoelectric conversion layer 22 converts light energy into electric energy. The organic photoelectric conversion layer 22 is formed to include, for example, two or more types of organic materials that each function as a p-type semiconductor or an n-type semiconductor. The organic photoelectric conversion layer 22 has a bulk heterojunction structure in the layer. The bulk heterojunction structure is a p/n junction surface that is formed by mixing the p-type semiconductor and the n-type semiconductor and excitons generated by absorbing light are separated into electrons and holes at the p/n junction interface. It is to be noted that the p-type semiconductor relatively functions as an electron donor (donor) and the n-type semiconductor relatively functions as an electron acceptor (acceptor). The organic photoelectric conversion layer 22 provides a field where excitons generated upon light absorption are separated into electrons and holes. Specifically, the excitons are separated into electrons and holes at the interface (p/n junction surface) between the electron donor and the electron acceptor.

The organic photoelectric conversion layer 22 may further include, in addition to the p-type semiconductor and the n-type semiconductor, three types of organic materials or so-called dye materials each of which photoelectrically converts light in a predetermined wavelength band while transmitting light in another wavelength band. It is preferable that the p-type semiconductor, the n-type semiconductor, and the dye materials each have a different absorption maximum wavelength. This makes it possible to widely absorb light in the visible light region.

In the present embodiment, a hole transporting material that absorbs blue light is used as one of two or three types of organic materials that form the organic photoelectric conversion layer 22. This hole transporting material that absorbs blue light has an absorption maximum wavelength on the shortest wavelength side, for example, among the two or three types of organic materials that form the organic photoelectric conversion layer 22. In addition, it is preferable that the hole transporting material which absorbs blue light have a shallower Highest Occupied Molecular Orbital (HOMO) level than the HOMO level of a second organic semiconductor material included in the organic photoelectric conversion layer 22 described below. Further, it is preferable that the hole transporting material which absorbs blue light have crystallizability and have a herringbone-type molecular arrangement, for example, in the layer of the organic photoelectric conversion layer 22.

Examples of such a hole transporting material that absorbs blue light include a dithieno[2,3-d:2',3'-d']benzo[1,2-b:4,5-b']dithiophene derivative (that is referred to as DTBDT derivative below) represented by the following general formula (1) or general formula (2). The DTBDT derivative represented by this general formula (1) or general formula (2) correspond to specific examples of a "first organic semiconductor material" according to the present disclosure.

[Chem. 1]

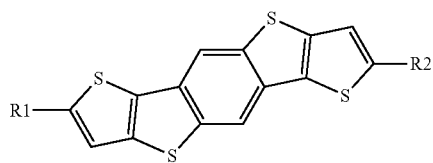
(1)

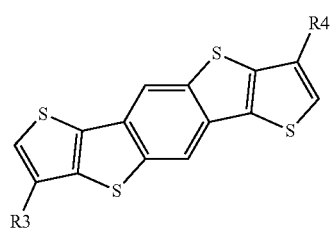
(2)

(R1, R2, R3, and R4 each independently represent a phenyl group, a biphenyl group, a terphenyl group, a naphthalene group, a phenylnaphthalene group, a biphenylnaphthalene group, a binaphthalene group, a thiophene group, a bithiophene group, a terthiophene group, a benzothiophene group, a phenyl benzothiophene group, a biphenyl benzothiophene group a benzofuran group, a phenyl benzofuran group, a biphenyl benzothiophene group, an alkane group, a cycloalkane group, a fluorene group, a phenylfluorene group, a carbazole group, or a derivative thereof.)

Specific substituents introduced into R1, R2, R3, and R4 include the following formula (A-1) to formula (A-53). A carbon atom bonded to A in any of the formulas forms a bond with a carbon atom bonded to any of R1, R2, R3, and R4 represented by the general formula (1) or the general formula (2).

[Chem. 2]

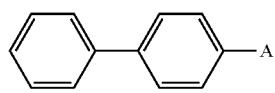
(A-1)

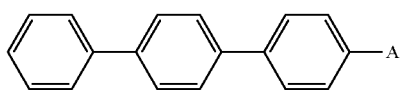
(A-2)

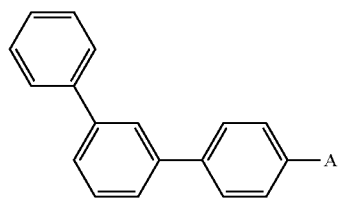
(A-3)

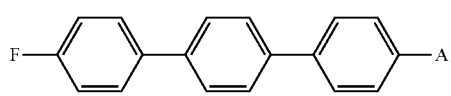
(A-4)

-continued

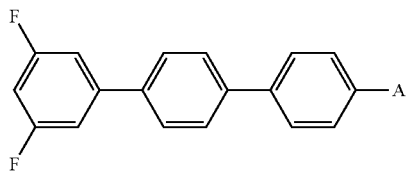
(A-5)

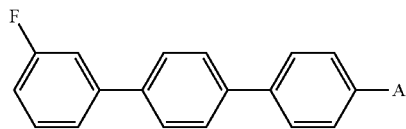
(A-6)

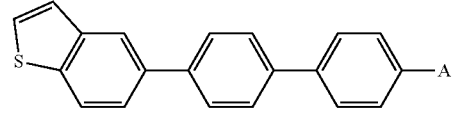
(A-7)

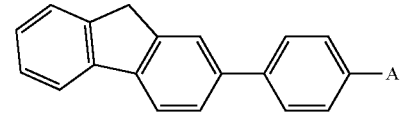
(A-8)

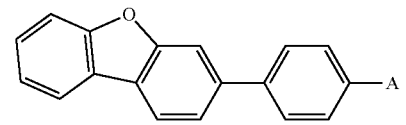
(A-9)

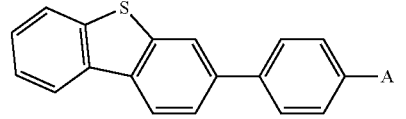
(A-10)

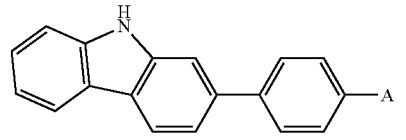
(A-11)

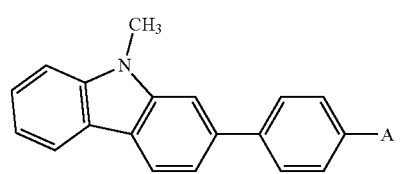
(A-12)

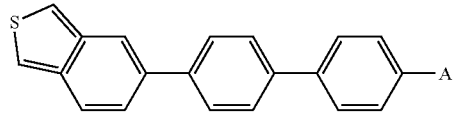
(A-13)

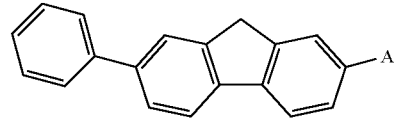
(A-14)

(A-15)

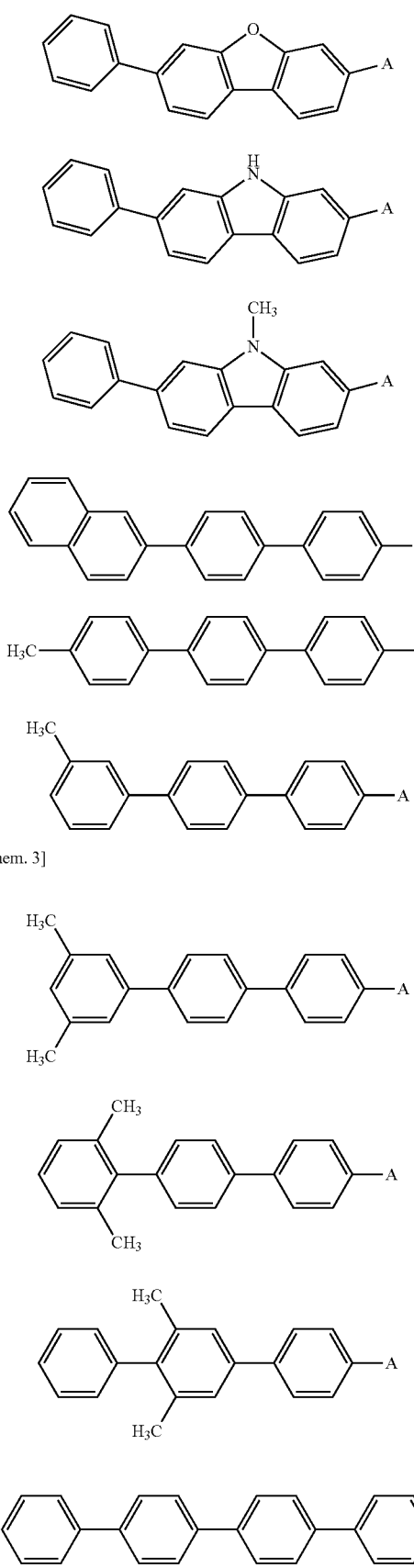
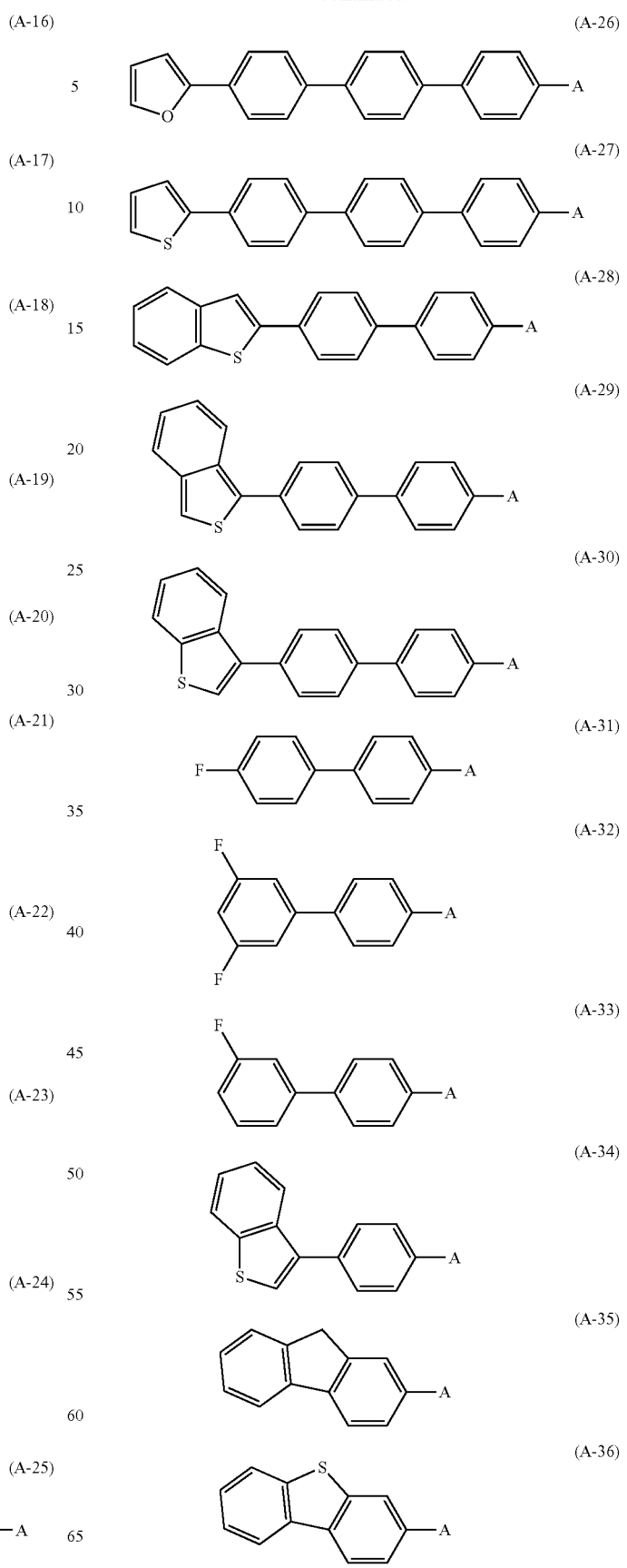

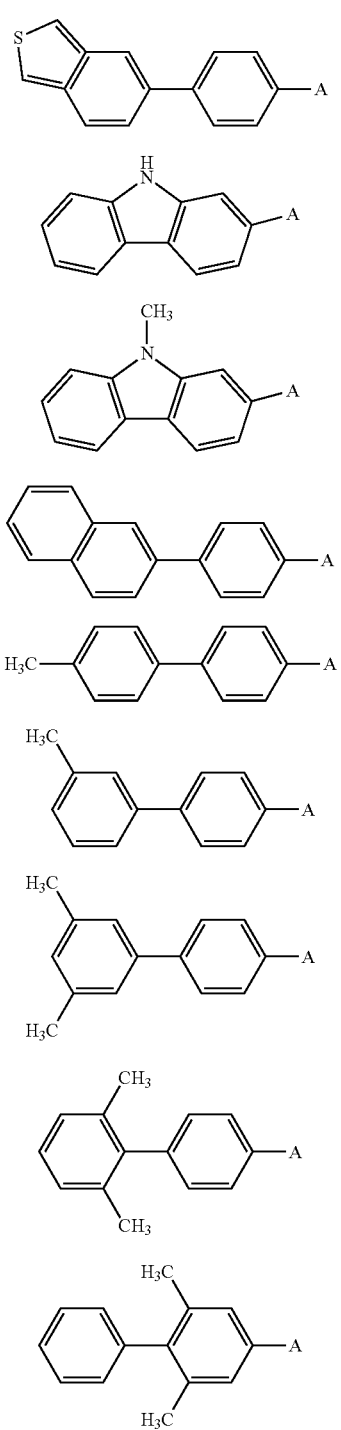
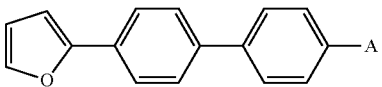
(A-46)
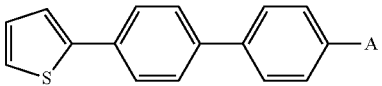
(A-47)
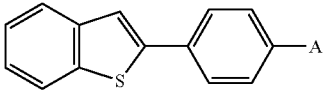
(A-48)
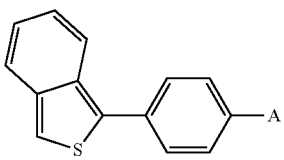
(A-49)
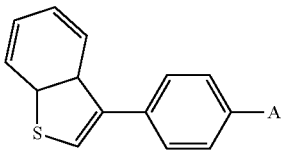
(A-50)
[Chem. 4]
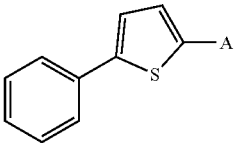
(1-51)
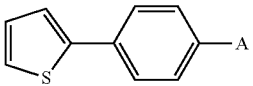
(1-52)
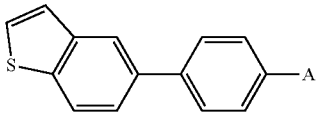
(1-53)
As a specific example of the DTBDT derivative represented by the general formula (1) or the general formula (2) described above, for example, the compounds represented by the following formula (1-1) to formula (1-5) are included.
[Chem. 5]
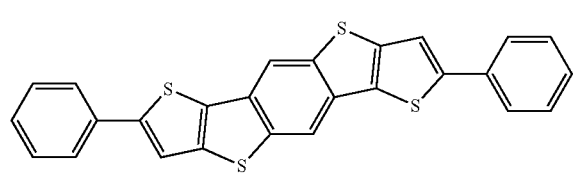
(1-1)

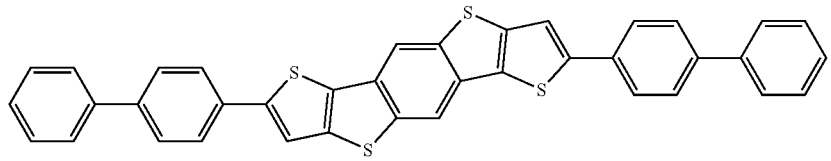
(1-2)

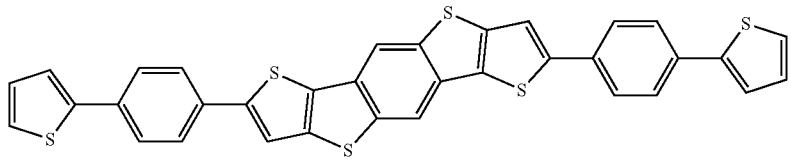
(1-3)

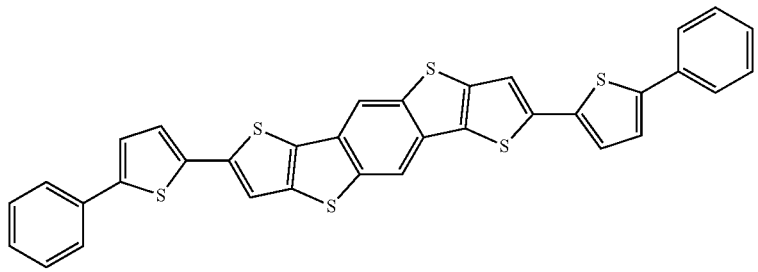
(1-4)

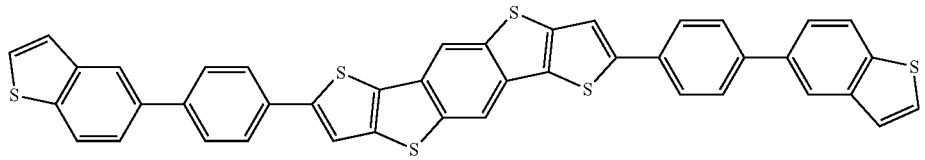
(1-5)

The organic photoelectric conversion layer 22 may further include an organic semiconductor material having an electron transporting property. This organic semiconductor material having an electron transporting property corresponds to a specific example of the "second organic semiconductor material" according to the present disclosure. Examples of the organic semiconductor material having an electron transporting property include the fullerene $C_{60}$ represented by the following formula (3) or the fullerene $C_{70}$ represented by the formula (4), a derivative thereof, or the like.

[Chem. 6]

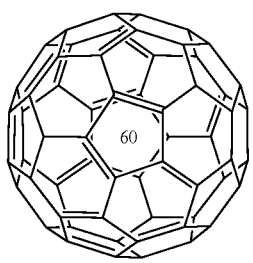
(3)

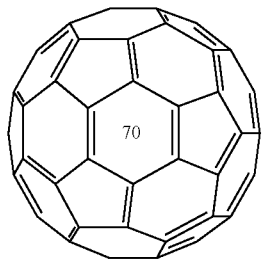
(4)

It is possible to form the organic photoelectric conversion layer 22 by using further an organic material or a so-called dye material that photoelectrically converts light in a predetermined wavelength band of the visible light region and transmits pieces of light in the other wavelength bands as one of the two or three types of organic materials that form the organic photoelectric conversion layer 22. This dye material corresponds to a specific example of a "third organic semiconductor material" according to the present disclosure.

Examples of the dye material include subphthalocyanine, dipyrromethene, merocyanine, or squarylium or a derivative thereof that absorbs light in a wavelength band of 500 nm or more and 600 nm or less. In addition, for example, any of naphthalene, anthracene, phenantherene, tetracene, pyrene, perylene, and fluoranthene or derivatives thereof may be used as the dye material. Alternatively, a polymer such as phenylenevinylene, fluorene, carbazole, indole, pyrene, pyrrole, picoline, thiophene, acetylene, or diacetylene or a derivative thereof may be used. Additionally, it is possible to favorably use a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthoquinone, an anthraquinone-based dye, a chain compound in which a fused polycyclic aromatic group such as anthracene and pyrene and an aromatic ring or a heterocyclic compound are fused, a cyanine-like dye bonded by two nitrogen-containing hetero rings such as quinoline, benzothiazole, and benzoxazole that have a squarylium group and a croconic methine group as a bonded chain or by a squarylium group and a croconic methine group, or the like. It is to be noted that a dithiol metal complex-based dye, a metallophthalocyanine dye, a metalloporphyrine dye, or a ruthenium complex dye is preferable as the metal complex dye described above, but this is not limitative.

In this way, the organic photoelectric conversion layer 22 is formed by using a plurality of organic semiconductor materials each having a different absorption maximum wavelength or a hole transporting material that absorbs blue light, a fullerene or a derivative thereof, and a so-called dye material in specific terms. This makes it possible to widely absorb light in the visible light region.

It is to be noted that the organic semiconductor materials described above function as a p-type semiconductor or an n-type semiconductor in accordance with a combination thereof.

For example, the variety of organic semiconductor materials described above are mixed and a vacuum evaporation method is used, thereby making it possible to form the organic photoelectric conversion layer 22. In addition, for example, spin coating technology, printing technology, or the like may be used.

The upper electrode 23 includes an electrically conducive film having light transmissivity as with the lower electrode 21.

There may be provided other layers between the organic photoelectric conversion layer 22 and the lower electrode 21 and between the organic photoelectric conversion layer 22 and the upper electrode 23. Specifically, for example, an electron blocking film, the organic photoelectric conversion layer 22, a hole blocking film, a work function adjustment layer, and the like may be stacked in order from the lower electrode 21 side. Further, there may be provided an underlying layer and a hole transport layer between the lower electrode 21 and the organic photoelectric conversion layer 22 and there may be provided a buffer layer and an electron transport layer between the organic photoelectric conversion layer 22 and the upper electrode 23.

The semiconductor substrate 30 includes, for example, an n-type silicon (Si) substrate and includes the p-well 31 in a predetermined region.

The inorganic photoelectric conversion section 32 includes, for example, a PIN (Positive Intrinsic Negative) type photodiode PD and has a pn junction in a predetermined region of the semiconductor substrate 30. The inorganic photoelectric conversion section 32 detects light (infrared light (IR)) in the wavelength range of a portion or the whole of the infrared light region. The second surface 30B of the semiconductor substrate 30 is provided with pixel transistors including a transfer transistor, an amplification transistor, a reset transistor, and the like in addition to the electric charge holding section 33.

The interlayer insulating layer 34 includes, for example, a single layer film including one of silicon oxide ($SiO_x$), TEOS, silicon nitride ($SiN_x$), silicon oxynitride (SiON), and the like or a stacked film including two or more of them.

It is possible to form the through electrode 35 by using, for example, metal materials such as aluminum (Al), tungsten (W), titanium (Ti), cobalt (Co), hafnium (H), and tantalum (Ta) in addition to a doped silicon material such as PDAS (Phosphorus Doped Amorphous Silicon).

The insulating film 36 is for electrically separating the semiconductor substrate 30 and the through electrode 35. It is possible to form the insulating film 36 by using silicon oxide ($SiO_x$), TEOS, silicon nitride ($SiN_x$), silicon oxynitride (SiON), and the like as with the interlayer insulating layer 34.

1-2. Configuration of Imaging Device

The imaging device 1 is, for example, a CMOS image sensor. The imaging device 1 takes in incident light (image light) from a subject through an optical lens system (not illustrated). The imaging device 1 converts the amount of incident light formed on the imaging surface as an image into electric signals in units of pixels and outputs the electric signals as pixel signals. The imaging device 1 includes a pixel section 100 serving as an imaging area on the semiconductor substrate 30. The imaging device 1 includes, for example, a vertical drive circuit 111, a column signal processing circuit 112, a horizontal drive circuit 113, an output circuit 114, a control circuit 115, and an input/output terminal 116 in a peripheral region of this pixel section 100.

The pixel section 100 includes, for example, the plurality of unit pixels P that is two-dimensionally disposed in a matrix. These unit pixels P are provided with a pixel drive line Lread (specifically, a row selection line and a reset control line) for each of the pixel rows and provided with a vertical signal line Lsig for each of the pixel columns. The pixel drive line Lread is for transmitting drive signals for reading out signals from the pixels. One end of the pixel drive line Lread is coupled to an output end corresponding to each of the rows of the vertical drive circuit 111.

The vertical drive circuit 11 includes a shift register, an address decoder, and the like and is a pixel driver that drives the respective unit pixels P of the pixel section 100, for example, in units of rows. The signals outputted from the respective unit pixels P in the pixel rows selectively scanned by the vertical drive circuit 111 are supplied to the column signal processing circuits 112 through the respective vertical signal lines Lsig. Each of the column signal processing circuits 112 includes an amplifier, a horizontal selection switch, and the like that are provided for each of the vertical signal lines Lsig.

The horizontal drive circuit 113 includes a shift register, an address decoder, and the like and drives the respective horizontal selection switches of the column signal processing circuits 112 in order while scanning the horizontal selection switches. This selective scanning by the horizontal drive circuit 113 outputs the signals of the respective pixels transmitted through the respective vertical signal lines Lsig to a horizontal signal line 121 in order and transmits the signals to the outside of the semiconductor substrate 30 through the horizontal signal line 121.

The output circuit 114 performs signal processing on the signals sequentially supplied from the respective column signal processing circuits 112 through the horizontal signal line 121 and outputs the signals. The output circuit 114 performs, for example, only buffering in some cases and performs black level adjustment, column variation correction, various kinds of digital signal processing, and the like in other cases.

The circuit portions including the vertical drive circuit 111, the column signal processing circuit 112, the horizontal drive circuit 113, the horizontal signal line 121, and the output circuit 114 may be formed directly on the semiconductor substrate 30 or may be provided in external control IC. In addition, those circuit portions may be formed in another substrate coupled by a cable or the like.

The control circuit 115 receives a clock supplied from the outside of the semiconductor substrate 30, data for an instruction about an operation mode, and the like and also outputs data such as internal information of the imaging device 1. The control circuit 115 further includes a timing generator that generates a variety of timing signals and controls the driving of peripheral circuits such as the vertical drive circuit 111, the column signal processing circuit 112, and the horizontal drive circuit 113 on the basis of the variety of timing signals generated by the timing generator.

An input/output terminal 16 exchanges signals with the outside.

1-3. Workings and Effects

It is possible in the photoelectric conversion element 10A according to the present embodiment and the imaging device 1 including the photoelectric conversion element 10A to extend the absorption spectrum of the organic photoelectric conversion layer 22 by forming the organic photoelectric conversion layer 22 with a hole transporting material that absorbs blue light. The following describes this.

Image sensors in each of which an organic photoelectric conversion film is used have been developed for CCD (Charge Coupled Device) image sensors, CMOS image sensors, and the like. For example, an organic imaging device is proposed in which an organic photoelectric conversion film is used that has a multilayer structure in which an organic photoelectric conversion film having sensitivity to blue light (B), an organic photoelectric conversion film having sensitivity to green light (G), and an organic photoelectric conversion film having sensitivity to red light (R) are sequentially stacked. This image sensor achieves an increase in the sensitivity by extracting B/G/R signals separately from one pixel. In addition, an imaging device has been proposed in which an organic photoelectric conversion film formed by using the one type of organic semiconductor material that has the maximum absorption in a predetermined wavelength range and the two types of organic semiconductor materials that have high transparency in the visible light region as described above is stacked on a semiconductor substrate in which a photodiode is formed as an inorganic photoelectric conversion section. In this imaging device, a signal of one color is extracted by the organic photoelectric conversion film and signals of two colors are extracted by silicon (Si) bulk spectroscopy.

Incidentally, in recent years, image sensors have been requested to be developed that are each able to capture images obtained from both visible light and infrared light (IR). For example, in a case where the organic imaging device described above is applied, it is possible to absorb a wider visible light region, but an issue is raised with difficulty in manufacturing a commercial-size imaging device by the current technology.

Meanwhile, in a case where the above-described organic photoelectric conversion film including the three types of organic semiconductor materials stacked on a semiconductor substrate in which a photodiode is formed as an inorganic photoelectric conversion section is applied as the photoelectric conversion film of the above-described image sensor for visible light, this organic photoelectric conversion film raises an issue with the inability to offer sufficient sensitivity because the organic photoelectric conversion film is configured to selectively absorb a predetermined range of the visible light region.

In contrast, in the present embodiment, a hole transporting material that absorbs blue light is used as an organic material included in the organic photoelectric conversion layer 22. This makes it possible to extend the absorption spectrum of the organic photoelectric conversion layer 22.

For example, the organic photoelectric conversion layer 22 is formed by using this hole transporting material that absorbs blue light and one or two types of organic materials that each have an absorption maximum wavelength different from the absorption maximum wavelength of the hole transporting material. This increases light absorption for the blue region as compared with a case where the organic photoelectric conversion layer 22 is formed by using the one type of organic semiconductor material that has the maximum absorption in the predetermined wavelength range and the two types of organic semiconductor materials that have high transparency in the visible light region described above.

As described above, a hole transporting material that absorbs blue light is used as an organic material included in the organic photoelectric conversion layer 22 in the photoelectric conversion element 10A according to the present embodiment. This makes it possible to extend the absorption spectrum of the organic photoelectric conversion layer 22. This makes it possible to provide the photoelectric conversion element 10A having a wide absorption spectrum and the imaging device 1 including the photoelectric conversion element 10A.

In addition, in the present embodiment, it is possible to form an organic photoelectric conversion layer that detects the blue light (B) and the red light (R) and an organic photoelectric conversion layer that detects the blue light and the green light (G) by selecting, as appropriate, a dye material that is used along with the hole transporting material which absorbs blue light described above. This makes it possible to decrease, from three layers to two layers or one layer, the number of organic photoelectric conversion films that are stacked in the organic imaging device described above in which the three organic photoelectric conversion films are stacked. In other words, it is possible to manufacture the photoelectric conversion element 10A widely having light absorption and the imaging device 1 including the photoelectric conversion element 10A in simple steps.

Next, modification examples 1 to 3 of the present disclosure are described. The following assigns the same signs to components similar to those of the embodiment described above and omits descriptions thereof as appropriate.

2. Modification Examples

2-1. Modification Example 1

FIG. 3 illustrates an example of a cross-sectional configuration of a photoelectric conversion element (photoelectric conversion element 10B) according to a modification example 1 of the present disclosure. The photoelectric conversion element 10A described in the embodiment described above may be further provided, for example, a dual bandpass filter 71 as a spectrum adjustment layer.

The dual bandpass filter 71 has respective transmission bands for the visible light region and the infrared light region. The dual bandpass filter 71 is provided, for example, above the color filter 51.

In a case where the color filters 51R, 51G, and 51B and the organic photoelectric conversion section 20 are disposed above the first surface 30A of the semiconductor substrate 30 serving as a light incidence surface as in the embodiment described above, the pieces of infrared light (IR) absorbed by the inorganic photoelectric conversion sections 32 of the respective unit pixels Pr, Pg, and Pb are the pieces of light that have passed through the respective color filters 51R. 51G, and 51B and the organic photoelectric conversion section 20. In other words, the pieces of infrared light (IR) absorbed by the inorganic photoelectric conversion sections 32 of the respective unit pixels Pr, Pg, and Pb each have a different spectrum. The respective unit pixels Pr, Pg, and Pb are thus different in sensitivity. This raises an issue with the unavailability of the respective unit pixels Pr, Pg, and Pb as IR pixels for generating the same infrared light image.

For this, in the present modification example, providing the dual bandpass filter 71 causes the pieces of infrared light (IR) detected by the inorganic photoelectric conversion sections 32 to be pieces of light in the wavelength region of the transmission band of the dual bandpass filter 71 on the infrared light region side. This allows the respective unit pixels Pr, Pg, and Pb to detect pieces of infrared light (IR) having uniform spectra. This allows the photoelectric conversion element 10B to obtain an IR image in which IR signals are used that are obtained from all of the unit pixels Pr, Pg. and Pb arranged two-dimensionally. This makes it possible to provide the imaging device 1 that is able to obtain an IR image with high resolution in addition to the effects of the embodiment described above.

In addition, it is also possible to use a multilayer film filter 81 as a spectrum adjustment layer as in a photoelectric conversion element 10C, for example, illustrated in FIG. 4 in addition to the dual bandpass filter 71. In the multilayer film filter 81, for example, films each including an inorganic material having a high refractive index and films each including an inorganic material having a low refractive index are periodically stacked alternatively in a repetitive manner. Examples of the inorganic material having a high refractive index include silicon nitride ($Si_3N_4$), titanium oxide ($TiO_2$), and the like. Examples of the inorganic material having a low refractive index include silicon oxide ($SiO_2$) and the like. It is possible to provide the multilayer film filter 81, for example, between the organic photoelectric conversion section 20 and the interlayer insulating layer 34.

In addition, it is also possible to obtain similar effects, for example, by providing a plasmon filter between the organic photoelectric conversion section 20 and the semiconductor substrate 30.

2-2. Modification Example 2

FIG. 5 schematically illustrates a cross-sectional configuration of a photoelectric conversion element (photoelectric conversion element 10D) according to a modification example 2 of the present disclosure. The photoelectric conversion element 10D is included in the one unit pixel P in the imaging device (imaging device 1) such as a CMOS image sensor that is able to capture, for example, an image obtained from visible light without using any color filter. The photoelectric conversion element 10D according to the present modification example is a photoelectric conversion element of a so-called vertical spectral type in which, for example, the one organic photoelectric conversion section 20 and two inorganic photoelectric conversion sections 32G and 32R are stacked in the vertical direction.

The organic photoelectric conversion section 20 and inorganic photoelectric conversion sections 32G and 32R each selectively detect light in a different wavelength range and perform photoelectric conversion. Specifically, the organic photoelectric conversion section 20 acquires, for example, a color signal of blue (B). The inorganic photoelectric conversion sections 32G and 32R respectively acquire color signals of green (G) and red (R) by using different absorption coefficients. This allows an imaging device 10 to acquire a plurality of types of color signals in one pixel without using any color filter.

The inorganic photoelectric conversion sections 32G and 32R are formed to be buried in the semiconductor substrate 30 and are stacked in the thickness direction of the semiconductor substrate 30. The second surface (front surface) 30B of the semiconductor substrate 30 is provided, for example, with floating diffusions (floating diffusion layers) FD1, FD2, and FD3, transfer transistors Tr2 and Tr3, an amplifier transistor AMP, a reset transistor RST, a selection transistor SEL, and the multilayer wiring layer 40.

For example, the interlayer insulating layer 34 and an insulating layer 37 are provided between the first surface 30A of the semiconductor substrate 30 and the lower electrode 21. The insulating layer 37 includes a layer (fixed electric charge layer) 37A having fixed electric charge and a dielectric layer 37B having an insulation property. There is provided a protective layer 52 on the upper electrode 23. There are provided a planarization layer (not illustrated) and an optical member such as an on-chip lens layer 53 including an on-chip lens 53L above the protective layer 52.

In this way, the present technology is also applicable to an imaging device that captures a visible light image. In addition, in the present modification example, the photoelectric conversion element 10D has been described in which the one organic photoelectric conversion section 20 and the two inorganic photoelectric conversion sections 32R and 32G are stacked, but the photoelectric conversion element according to the present technology may have a configuration in which, for example, two respective organic photoelectric conversion sections that detect the blue light (B) and the green light (G) and one inorganic photoelectric conversion section that detects the red light (R) are stacked.

2-3. Modification Example 3

FIG. 6 illustrates a cross-sectional configuration of a photoelectric conversion element (photoelectric conversion element 10E) according to a modification example 3 of the present disclosure. The photoelectric conversion element 10E is included in the one unit pixel P in the imaging device (imaging device 1) such as a CMOS image sensor that is able to capture, for example, an image obtained from visible light without using any color filter as with the photoelectric conversion element 10D according to the modification example 2 described above. The photoelectric conversion element 10E according to the present modification example has a configuration in which a red photoelectric conversion section 90R, a green photoelectric conversion section 90G, and a blue photoelectric conversion section 90B are stacked on the semiconductor substrate 30 in this order with an insulating layer 96 interposed in between.

The red photoelectric conversion section 90R, the green photoelectric conversion section 90G, and the blue photoelectric conversion section 90B respectively include organic photoelectric conversion layers 92R, 92G, and 92B between pairs of electrodes. Specifically, the red photoelectric conversion section 90R, the green photoelectric conversion section 90G, and the blue photoelectric conversion section 90B respectively include the organic photoelectric conversion layers 92R, 92G, and 92B between a first electrode 91R and a second electrode 93R, between a first electrode 91O and a second electrode 93G, and between a first electrode 91B and a second electrode 93B.

There is provided an on-chip lens 98L above the blue photoelectric conversion section 90B with a protective layer 97 and an on-chip lens layer 98 interposed in between. There are provided a red electricity storage layer 310R, a green electricity storage layer 310G, and a blue electricity storage layer 310B in the semiconductor substrate 30. Light entering the on-chip lens 98L is photoelectrically converted by the red photoelectric conversion section 90R, the green photoelectric conversion section 90G, and the blue photoelectric conversion section 90B and the signal charge is transmitted from the red photoelectric conversion section 90R to the red electricity storage layer 310R, from the green photoelectric conversion section 90G to the green electricity storage layer 310G, and from the blue photoelectric conversion section 90B to the blue electricity storage layer 310B. Although the signal charge may be electrons or holes generated by photoelectric conversion, the following gives description by exemplifying a case where electrons are read out as signal charge.

The semiconductor substrate 30 includes, for example, a p-type silicon substrate. The red electricity storage layer 310R, the green electricity storage layer 310G, and the blue electricity storage layer 310B provided in this semiconductor substrate 30 each include an n-type semiconductor region and signal charge (electrons) supplied from the red photoelectric conversion section 90R, the green photoelectric conversion section 90G, and the blue photoelectric conversion section 90B is accumulated in these n-type semiconductor regions. The n-type semiconductor regions of the red electricity storage layer 310R, the green electricity storage layer 310G, and the blue electricity storage layer 310B are formed, for example, by doping the semiconductor substrate 30 with an n-type impurity such as phosphorus (P) or arsenic (As). It is to be noted that the semiconductor substrate 30 may be provided on a support substrate (not illustrated) including glass or the like.

The semiconductor substrate 30 includes a pixel transistor for reading out electrons from the red electricity storage layer 310R, the green electricity storage layer 310G, and the blue electricity storage layer 310B and transferring the read electrons, for example, to a vertical signal line (vertical signal line Lsig in FIG. 2). The floating diffusion of this pixel transistor is provided in the semiconductor substrate 30 and this floating diffusion is coupled to the red electricity storage layer 310R, the green electricity storage layer 310G, and the blue electricity storage layer 310B. The floating diffusion includes an n-type semiconductor region.

The insulating layer 96 includes, for example, silicon oxide ($SiO_x$), silicon nitride ($SiN_x$), silicon oxynitride (SiON), hafnium oxide ($HfO_x$), and the like. The insulating layer 96 may include a plurality of types of insulating films that is stacked. The insulating layer 96 may include an organic insulating material. This insulating layer 96 is provided with plugs and electrodes for coupling the red electricity storage layer 310R and the red photoelectric conversion section 90R, the green electricity storage layer 310G and the green photoelectric conversion section 90G, and the blue electricity storage layer 310B and the blue photoelectric conversion section 90B.

The red photoelectric conversion section 90R includes the first electrode 91R, the organic photoelectric conversion layer 92R, and the second electrode 93R in this order from positions close to the semiconductor substrate 30. The green photoelectric conversion section 90G includes the first electrode 91G, the organic photoelectric conversion layer 92G, and the second electrode 93G in this order from positions close to the red photoelectric conversion section 90R. The blue photoelectric conversion section 90B includes the first electrode 91B, the organic photoelectric conversion layer 92B, and the second electrode 93B in this order from positions close to the green photoelectric conversion section 90G. The insulating layer 44 is provided between the red photoelectric conversion section 90R and the green photoelectric conversion section 90G. There is provided an insulating layer 95 between the green photoelectric conversion section 90G and the blue photoelectric conversion section 90B. The red photoelectric conversion section 90R, the green photoelectric conversion section 90G, and the blue photoelectric conversion section 90B respectively absorb selectively red (e.g., a wavelength of 600 nm or more and less than 700 nm) light, green (e.g., a wavelength of 480 nm or more and less than 600 nm) light, and blue (e.g., a wavelength of 400 nm or more and less than 480 nm) light to generate electron/hole pairs.

The first electrode 91R, the first electrode 91G, and the first electrode 91B respectively extract the signal charge generated in the organic photoelectric conversion layer 92R, the signal charge generated in the organic photoelectric conversion layer 92G, and the signal charge generated in the organic photoelectric conversion layer 92B. The first electrodes 91R, 91G, and 91B are provided, for example, for each of the pixels. Each of these first electrodes 91R, 91G, and 91B includes, for example, an electrically conductive material having light transmissivity. Specifically, each of these first electrodes 91R, 91G, and 91B includes ITO. Each of the first electrodes 91R, 91G, and 91B may include, for example, a tin oxide-based material or a zinc oxide-based material. The tin oxide-based material is obtained by adding a dopant to tin oxide. Examples of the zinc oxide-based material include aluminum zinc oxide in which aluminum is added to zinc oxide as a dopant, gallium zinc oxide in which gallium is added to zinc oxide as a dopant, indium zinc oxide in which indium is added to zinc oxide as a dopant, and the like. In addition, it is also possible to use IGZO, CuI, $InSbO_4$, ZnMgO, $CuInO_2$, $MgIn_2O_4$, CdO, $ZnSnO_3$, and the like.

For example, there may be provided electron transport layers between the first electrode 91R and the organic photoelectric conversion layer 92R, between the first electrode 91G and the organic photoelectric conversion layer 92G, and between the first electrode 91B and the organic photoelectric conversion layer 92B. The electron transport layers are for facilitating the electrons generated in the organic photoelectric conversion layers 92R, 92G, and 92B to be supplied to the first electrodes 91R, 91G, and 91B. Each of the electron transport layers includes, for example, titanium oxide, zinc oxide, or the like. Each of the electron transport layers may include titanium oxide and zinc oxide that are stacked.

Each of the organic photoelectric conversion layers 92R, 92G, and 92B absorbs light in a selective wavelength range for photoelectric conversion and transmits light in another wavelength range. Here, the light in the selective wavelength range is light, for example, in the wavelength range of a wavelength of 600 nm or more and less than 700 nm in the organic photoelectric conversion layer 92R, light, for example, in the wavelength range of a wavelength of 480 nm or more and less than 600 nm in the organic photoelectric conversion layer 92G, and light, for example, in the wavelength range of a wavelength of 400 nm or more and less than 480 nm in the organic photoelectric conversion layer 92B.

Each of the organic photoelectric conversion layers 92R, 92G, and 92B has a configuration similar to that of the organic photoelectric conversion layer 12 according to the embodiment described above. For example, each of the organic photoelectric conversion layers 92R, 92G, and 92B includes, for example, two or more types of organic semiconductor materials. It is preferable that each of the organic photoelectric conversion layers 92R, 92G, and 92B include, for example, any one or both of a p-type semiconductor and an n-type semiconductor. For example, in a case where each of the organic photoelectric conversion layers 92R, 92G, and 92B includes the two types of organic semiconductor materials of a p-type semiconductor and an n-type semiconductor, for example, one of the p-type semiconductor and the n-type semiconductor is preferably a material having transmissivity to visible light and the other thereof is preferably a material that photoelectrically converts light in a selective wavelength range. Alternatively, it is preferable that each of the organic photoelectric conversion layers 92R, 92G, and 92B include the three types of organic semiconductor materials of a material (dye material) that photoelectrically converts light in a selective wavelength range and the n-type semiconductor and the p-type semiconductor each having transmissivity to visible light.

For example, it is preferable to use, for example, a material (dye material) that allows light in the wavelength range of a wavelength of 600 nm or more and less than 700 nm to be photoelectrically converted for the organic photoelectric conversion layer 92R. Examples of such a material include subnaphthalocyanine or a derivative thereof and phthalocyanine or a derivative thereof. For example, it is preferable to use, for example, a material (dye material) that allows light in the wavelength range of a wavelength of 480 nm or more and less than 600 nm to be photoelectrically converted for the organic photoelectric conversion layer 92G. Examples of such a material include subphthalocyanine or a derivative thereof or the like. It is preferable to use, for example, a material (dye material) that allows light in the wavelength range of a wavelength of 400 nm or more and less than 480 nm to be photoelectrically converted for the organic photoelectric conversion layer 92B. Such a material includes the DTBDT derivative represented by the general formula (1) or the general formula (2) or the like. In addition, it may use, for example, a mixture of coumarin or a derivative thereof and porphyrin or a derivative thereof for the organic photoelectric conversion layer 92B in addition to the materials described above.

For example, there may be provided hole transport layers between the organic photoelectric conversion layer 92R and the second electrode 93R, between the organic photoelectric conversion layer 92G and the second electrode 93G, and between the organic photoelectric conversion layer 92B and the second electrode 93B. The hole transport layers are for facilitating the holes generated in the organic photoelectric conversion layers 92R, 92G, and 92B to be supplied to the second electrodes 93R, 93G, and 93B. Each of the hole transport layers includes, for example, molybdenum oxide, nickel oxide, vanadium oxide, or the like. Each of the hole transport layers may include an organic material such as PEDOT (Poly(3,4-ethylenedioxythiophene) and TPD (N,N'-Bis(3-methylphenyl)-N,N'-diphenylbenzidine).

The second electrode 93R, the second electrode 93G, and the second electrode 93B are for respectively extracting the holes generated in the organic photoelectric conversion layer 92R, the holes generated in the organic photoelectric conversion layer 92G, and the holes generated in the organic photoelectric conversion layer 92G. The holes extracted from each of the second electrodes 93R, 93G, and 93B are discharged, for example, to a p-type semiconductor region (not illustrated) in the semiconductor substrate 30 through each of the transmission paths (not illustrated). Each of the second electrodes 93R. 93G, and 93B includes, for example, an electrically conductive material such as gold, silver, copper, and aluminum. As with the first electrodes 91R, 91G, and 91B, each of the second electrodes 93R, 93G, and 93B may include a transparent electrically conductive material. In the photoelectric conversion element 10E, the holes extracted from these second electrodes 93R. 93G, and 93B are discharged. For example, in a case where the plurality of photoelectric conversion elements 10E is disposed in the imaging device 1 described below, the second electrodes 93R, 93G, and 93B may be thus provided that are common between the respective photoelectric conversion elements 10E (unit pixels P).

An insulating layer 94 is for insulating the second electrode 93R and the first electrode 91G. The insulating layer 95 is for insulating the second electrode 93G and the first electrode 91B. Each of the insulating layers 94 and 95 includes, for example, metal oxide, metal sulfide, or an organic substance. Examples of the metal oxide include silicon oxide, aluminum oxide, zirconium oxide, titanium oxide, zinc oxide, tungsten oxide, magnesium oxide, niobium oxide, tin oxide, gallium oxide, and the like. Examples of the metal sulfide include zinc sulfide, magnesium sulfide, and the like. It is preferable that the band gap of a material included in each of the insulating layers 94 and 95 be 3.0 eV or more.

As described above, the present technology is also applicable to a photoelectric conversion element (photoelectric conversion element 10E) in which the red photoelectric conversion section 90R, the green photoelectric conversion section 90G, and the blue photoelectric conversion section 90B are stacked in this order. The red photoelectric conversion section 90R, the green photoelectric conversion section 90G, and the blue photoelectric conversion section 90B include the respective photoelectric conversion layers (organic photoelectric conversion layers 92R, 92G, and 92B). Each of the photoelectric conversion layers (organic photoelectric conversion layers 92R, 92G, and 92B) includes an organic semiconductor material.

3. Application Examples

The imaging device 1 described above is applicable to any type of electronic apparatus having an imaging function, for example, a camera system such as a digital still camera and a video camera, a mobile phone having an imaging function, and the like. FIG. 7 illustrates a schematic configuration of an electronic apparatus 1000.

The electronic apparatus 1000 includes the imaging device 1, a DSP (Digital Signal Processor) circuit 1001, a frame memory 1002, a display unit 1003, a recording unit 1004, an operation unit 1005, and a power supply unit 1006. They are coupled to each other through a bus line 1007.

The DSP circuit 1001 is a signal processing circuit that processes a signal supplied from the imaging device 1. The DSP circuit 1001 outputs image data that is obtained by processing the signal from the imaging device 1. The frame memory 1002 temporarily retains the image data processed by the DSP circuit 1001 in units of frames.

The display unit 1003 includes, for example, a panel-type display device such as a liquid crystal panel or an organic EL (Electro Luminescence) panel and records the image data of a moving image or a still image captured by the imaging device 1 in a recording medium such as a semiconductor memory or a hard disk.

The operation unit 1005 outputs an operation signal for a variety of functions of the electronic apparatus 1000 in accordance with an operation by a user. The power supply unit 1006 appropriately supplies the DSP circuit 1001, the frame memory 1002, the display unit 1003, the recording unit 1004, and the operation unit 1005 with various kinds of power for operations of these supply targets.

4. Practical Application Examples

Example of Practical Application to Endoscopic Surgery System

The technology (the present technology) according to the present disclosure is applicable to a variety of products. For example, the technology according to the present disclosure may be applied to an endoscopic surgery system.

FIG. 8 is a view depicting an example of a schematic configuration of an endoscopic surgery system to which the technology according to an embodiment of the present disclosure (present technology) can be applied.

In FIG. 8, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 9 is a block diagram depicting an example of a functional configuration of the camera head 11102 and the CCU 11201 depicted in FIG. 8.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The example of the endoscopic surgery system to which the technology according to the present disclosure may be applied has been described above. The technology according to the present disclosure may be applied to the image pickup unit 11402 among the components described above. The application of the technology according to the present disclosure to the image pickup unit 11402 increases the detection accuracy.

It is to be noted that the endoscopic surgery system has been described here as an example, but the technology according to the present disclosure may be additionally applied, for example, to a microscopic surgery system or the like.

Example of Practical Application to Mobile Body

The technology according to the present disclosure is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

FIG. 10 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 10, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 10, an audio speaker 12061, a display section 12062, and an instrument panel 12063 are illustrated as the output device. The display section 12062 may, for example, include at least one of an on-board display and a head-up display.

FIG. 11 is a diagram depicting an example of the installation position of the imaging section 12031.

In FIG. 11, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 11 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

5. Working Examples

Next, working examples of the present disclosure are described in detail. In an experiment 1, the compound represented by the formula (0-1) described above and the thin film of the organic photoelectric conversion layer 22 described above were formed as the hole transporting material that absorbs blue light and the spectral characteristics thereof were evaluated. In an experiment 2, the crystallizability of the thin film described above was evaluated. In the experiment 2, the crystal structure of the compound represented by the formula (1-1) described above was evaluated. In an experiment 4, a device sample including the organic photoelectric conversion layer 22 described above was fabricated and the electric characteristics thereof were evaluated.

Experiment 1: Evaluation of Spectral Characteristics of Thin Film

A sample for evaluating spectral characteristics was fabricated by using the following method. First, a quartz glass substrate cleaned in UV/ozone treatment was moved to a vacuum evaporation device and a film of the compound represented by the formula (1-1) was formed at a substrate temperature of 0° C. under a reduced pressure condition of $1 \times 10^{-5}$ Pa or less by using a resistive heating method while a substrate holder was rotated. Evaporation was performed at an evaporation speed of 0.1 nm/second to offer a film thickness of 50 nm (experimental example 1-1). Similarly, a film of the compound (rBDT) (experimental example 1-2) represented by the following formula (5) that was usable as the hole transporting material was formed as with the compound represented by the formula (1-1). In addition, along with the compound represented by the formula (1-1) and the compound represented by the formula (5), films of the subphthalocyanine (SubPc) (experimental example 1-3) represented by the following formula (6) and the fullerene $C_{60}$ (experimental example 1-4) represented by the formula (3) described above that were used as materials of an organic photoelectric conversion layer were formed.

[Chem. 7]

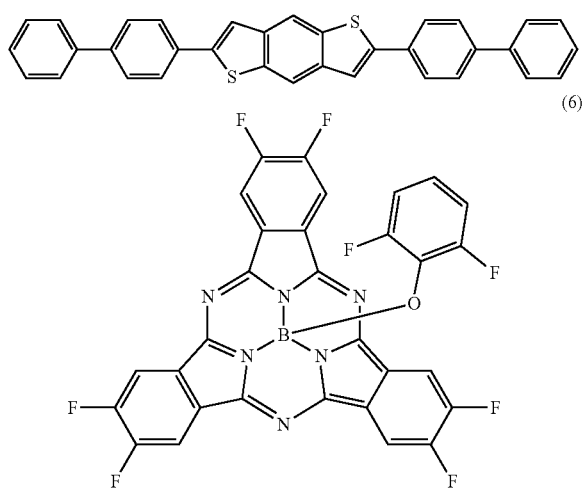

In addition, similarly, a thin film (experimental example 1-5) including the three types of organic materials of the compound represented by the formula (1-1), subphthalocyanine (SubPc), and a fullerene $C_{60}$ was formed. The respective evaporation speeds were 0.5 nm/second, 0.5 nm/second, and 0.25 nm/second and the film thickness was 200 nm. Similarly, a thin film (experimental example 1-6) including the three types of organic materials of the compound (rBDT) represented by the formula (5), subphthalocyanine (SubPc), and a fullerene Co was formed. The respective evaporation speeds were 0.5 nm/second, 0.5 nm/second, and 0.25 nm/second and the film thickness was 200 nm. These experimental example 1-5 and experimental example 1-6 were used as samples for evaluating the spectral characteristics of the ternary organic photoelectric conversion layer.

In addition, similarly, a thin film (experimental example 1-7) including the two types of organic materials of the compound represented by the formula (1-1) and subphthalocyanine (SubPc) was formed. The respective evaporation speeds were 0.5 nm/second and 0.5 nm/second and the film thickness was 100 nm. Similarly, a thin film (experimental example 1-8) including the two types of organic materials of the compound (rBDT) represented by the formula (5) and subphthalocyanine (SubPc) was formed. The respective evaporation speeds were 0.5 nm/second and 0.5 nm/second and the film thickness was 100 nm. These experimental example 1-7 and experimental example 1-8 were used as samples for evaluating the spectral characteristics of the binary organic photoelectric conversion layer.

As the spectral characteristics, the absorptivity (%) of light absorbed by each thin film was obtained by measuring the transmittance and the reflectance of the wavelength region corresponding to a wavelength $\lambda = 350$ to 700 nm for each of the wavelengths with an ultraviolet and visible spectrophotometer. A linear absorption coefficient $\alpha$ ($cm^{-1}$) of each thin film for each wavelength was evaluated on the basis of the Lambert-Beer law by using this absorptivity of light and the film thickness of the thin film as parameters. $\lambda_{max}$ (nm) was the wavelength observed on the longest wavelength among the wavelengths indicating the maximum value of the linear absorption coefficient observed in a certain absorption spectrum.

FIG. 12 illustrates the absorption spectra of a thin film (experimental example 1-1) including the compound represented by the formula (1-1) and a thin film (experimental example 1-2) including the compound (rBDT) represented by the formula (5). FIG. 13 illustrates the absorption spectra of a thin film (experimental example 1-3) including the experimental example 1-1 and subphthalocyanine (SubPc) and a thin film (experimental example 1-4) including a fullerene $C_{60}$. FIG. 14 illustrates the absorption spectra of thin films included in the ternary organic photoelectric conversion layer of the experimental example 1-5 and the experimental example 1-6 described above. FIG. 15 illustrates the absorption spectra of thin films included in the binary organic photoelectric conversion layer of the experimental example 1-7 and the experimental example 1-8 described above.

FIG. 12 illustrates that the compound represented by the formula (1-1) has a higher linear absorption coefficient in the region of $\lambda = 350$ to 500 nm than that of the compound (rBDT) represented by the formula (5). In other words, it has been found that the compound represented by the formula (1-1) is a hole transporting material having increased light absorption ability. For example, $\alpha$ in $\lambda = 450$ nm was $7.3 \times 10^4$ $cm^{-1}$ for the compound represented by the formula (1-1) and $0.5 \times 10^4$ $cm^{-1}$ for the compound (rBDT) represented by the formula (5). In other words, it has been found that the light absorption ability of the compound represented by the formula (1-1) is increased 15 times on this wavelength. Further, it has been found that $\alpha$ of the compound represented by the formula (5) is substantially 0 in $\lambda = 450$ to 500 nm and no light is absorbed. Meanwhile, the compound represented by the formula (1-1) exhibits light absorption in even this wavelength range. This indicates that the compound represented by the formula (1-1) is a material having higher light absorption ability than that of the compound (rBDT) represented by the formula (5).

FIG. 13 illustrates that the compound represented by the formula (1-1), subphthalocyanine (SubPc), and a fullerene $C_{60}$ each efficiently absorb a different wavelength region. For example, it has been found that a of the compound represented by the formula (1-1) is the highest in the blue region of 400 nm to 430 nm and light within this range is efficiently absorbed. It has been found that α of subphthalocyanine (SubPc) is the highest in the green region of 500 nm to 580 nm and light within this range is efficiently absorbed. It has been found that α of a fullerene $C_{60}$ is the highest in the red region of 600 nm to 650 nm and light within this range is efficiently absorbed.

In addition, Table 1 tabulates $\lambda_{max}$ (nm) of the compound represented by the formula (1-1), subphthalocyanine (SubPc), and a fullerene $C_{60}$. Table 1 indicates that the compound represented by the formula (1-1), subphthalocyanine (SubPc), and a fullerene $C_{60}$ are different from each other in $\lambda_{max}$ (nm). Among them, λmax of the compound represented by the formula (1-1) is the shortest wavelength.

TABLE 1

|  | λmax (nm) |
| --- | --- |
| $C_{60}$ | 612 |
| formula (1-1) | 367 |
| SubPc | 563 |

The above indicates that the three types of organic materials which form the ternary organic photoelectric conversion layer 22 each absorb light in a different wavelength region and this is effective to increase the light absorption ability of the organic photoelectric conversion layer. This can also be seen from FIG. 14.

In addition, FIG. 14 illustrates that, in a case where the compound represented by the formula (1-1) is used as a hole transporting material, even a binary organic photoelectric conversion layer has a larger optical absorption coefficient within a range of 350 nm to 500 nm than the use of the compound (rBDT) represented by the formula (5). As can be seen from FIG. 12, this is derived from the higher optical absorption coefficient of the compound represented by the formula (1-1) within a range of 350 nm to 500 nm than that of the compound (rBDT) represented by the formula (5). In other words, it has been found that the use of the compound represented by the formula (1-1) that has high light absorption ability as a hole transporting material allows the ternary organic photoelectric conversion layer 22 to have a panchromatic spectral shape. It is to be noted that a hole transporting material serves to absorb light in the blue region, a dye serves to absorb light in the green region, and an electron transport material serves to absorb light in the red region in this organic photoelectric conversion layer 22 (experimental example 1-5).

Further, FIG. 15 illustrates that, in a case where the compound represented by the formula (1-1) is used as a hole transporting material, the optical absorption coefficient within a range of 350 nm to 500 nm is larger than the use of the compound represented by the formula (5). As with the ternary organic photoelectric conversion layer (experimental example 1-5), this is derived from the higher optical absorption coefficient of the compound represented by the formula (1-1) within a range of 350 nm to 500 nm than that of the compound represented by the formula (5). In other words, it has been found that the use of the compound represented by the formula (1-1) that has high light absorption ability as a hole transporting material allows the binary organic photoelectric conversion layer 22 to have a panchromatic spectral shape. It is to be noted that a hole transporting material serves to absorb light in the blue region and a dye serves to absorb light in the green region in this organic photoelectric conversion layer 22 (experimental example 1-7).

Experiment 2: Evaluation of Crystallizability of Thin Film

A sample for evaluating the crystallizability of a thin film was fabricated by using the following method. First, an ITO film having a thickness of 50 nm was formed on a glass substrate by using a sputtering device. This ITO film was patterned by photolithography and etching and used as an ITO electrode. Subsequently, the glass substrate provided with the ITO electrode was cleaned in UV/ozone treatment and a film of the compound represented by the formula (1-1) was then formed by a vacuum evaporation device at a substrate temperature of 20° C. under a reduced pressure condition of $1 \times 10^{-5}$ Pa or less in a resistive heating method while a substrate holder was rotated. Evaporation was performed at a vacuum evaporation speed of 0.1 nm/second to offer a film thickness of 50 nm. This was used as a sample for evaluating the crystallizability of a thin film of the compound represented by the formula (1-1) (experimental example 2-1).

Similarly, the compound represented by the formula (1-1), subphthalocyanine (SubPc) and a fullerene $C_{60}$ were co-evaporated on a glass substrate in a resistive heating method at a substrate temperature of 20° C. under a reduced pressure condition of $1 \times 10^{-5}$ Pa or less by a vacuum evaporation device while a substrate holder was rotated. The glass substrate had been cleaned in UV/ozone treatment. The glass substrate had a film thickness of 50 nm and was provided with the ITO electrode. The respective evaporation speeds were 0.5 nm/second, 0.5 nm/second, and 0.25 nm/second and the film thickness was 230 nm. This was used as a sample for evaluating the crystallizability of a ternary thin film (experimental example 2-2).

To evaluate the crystallizability of the thin film described above, an X-ray diffraction device whose X-ray source was CuKα was used for X-ray radiation and the X-ray diffraction in the out-of-plane direction was measured within the range of 2θ=2 to 30° by using a grazing incidence method.

FIG. 16 illustrates the X-ray diffraction pattern of a thin film (experimental example 2-1) including the compound represented by the formula (1-1). FIG. 17 illustrates the X-ray diffraction pattern of a thin film (experimental example 2-2) including the compound represented by the formula (1-1), subphthalocyanine (SubPc), and a fullerene $C_{60}$.

It has been found that any of the samples has about three clear peaks within the range of 2θ=18 to 29°. In addition, no peaks were confirmed in the other regions of any of the samples. Further, FIG. 16 illustrates these three clear peaks. This indicates that these peaks are derived from the compound represented by the formula (1-1). In other words, it has been found that the compound represented by the formula (1-1) has crystallizability in a case of a thin film. In addition, FIG. 17 illustrates these peaks at similar positions.

This indicates that the compound represented by the formula (1-1) also has crystallizability in a ternary organic photoelectric conversion layer.

In addition, the peak positions and the crystallite sizes of the experimental example 2-1 and the experimental example 2-2 were evaluated by using the following method. The following defines the three clear peaks as a first peak, a second peak, and a third peak in order from the low angle side.

The respective peak positions of the first peak, the second peak, and the third peak were obtained by fitting the respective peaks from the spectrum subjected to background subtraction with the Pearson VII function. The crystallite size was obtained by fitting the second peak with the Pearson VII function to obtain the half width thereof and substituting the half width into the Scherrer's equation. In this case, 0.94 was used as a Scherrer constant K.

Table 2 tabulates the respective peak positions and crystallite sizes of the first peak, the second peak and the third peak.

TABLE 2

|  |  | peak position 2θ(°) | crystallite size (nm) |
|---|---|---|---|
| experimental example 2-1 | first peak | 19.0 | 13.8 |
|  | second peak | 23.4 | 10.9 |
|  | third peak | 27.9 | 10.5 |
| experimental example 2-2 | first peak | 19.0 | 15.2 |
|  | second peak | 23.4 | 16.7 |
|  | third peak | 27.9 | 12.8 |

The peak positions of the first peaks, the peak positions of the second peaks, and the peak positions of the third peaks of a thin film (experimental example 2-1) of the compound represented by the formula (1-1) and a ternary thin film (experimental example 2-2) were respectively 19.0° and 19.0°, 23.4° and 23.4°, and 27.9° and 27.9°. The peak positions of the first peaks, the second peaks, and the third peaks are not changed between the experimental example 2-1 and the experimental example 2-2. This means that the first peaks, the second peaks, and the third peaks are each derived from the compound represented by the formula (1-1). The crystallite sizes of the experimental example 2-1 and the experimental example 2-2 were respectively 13.8 nm and 15.2 nm for the first peaks, 10.9 nm and 16.7 nm for the second peaks, and 10.5 nm and 12.8 nm for the third peaks. It has been found that the ternary thin film generally increases in particle size. This indicates that the compound represented by the formula (1-1) is a stable material that does not change the crystallizability even in a case where the compound is mixed with another material and serves as a co-evaporation film.

Experiment 3: Evaluation of Crystal Structure

An experiment 3 studied what molecular arrangement feature of the compound represented by the formula (1-1) caused the first peak, the second peak, and the third peak observed in the experiment 2.

Experiment 3

As a sample for evaluating a crystal structure, a single crystal of the compound represented by the formula (1-1) that had the shape of a block of 0.13 mm 0.09 mm×0.07 mm was fabricated in a sublimation purification method. For this sample, an X-ray structural analysis in which a MoKα ray having a wavelength of 0.71073 Å was used as an X-ray source was conducted by using XtaLab AFC11 (RINC). 14584 reflections in total were measured within the range of θ=2.067 to 27.484°. The structure was solved in the direct method SIR-2004 by using the collected pieces of diffraction data. Structural optimization was performed in a least square method for a structure factor $F^2$. From a result of the structural optimization obtained, the powder X-ray diffraction pattern was obtained in a case where CuKα was used as an X-ray source.

Table 3 tabulates the crystal data and a result of the structure optimization of the compound represented by the formula (1-1). FIG. 18 illustrates the molecular arrangement of the compound represented by the formula (1-1) viewed from the c axis. FIG. 19 simulates the powder X-ray diffraction pattern of the compound represented by the formula (1-1) in a case where CuKα is used as an X-ray source.

TABLE 3

| formula | $C_{38}H_{22}S_4$ |
|---|---|
| spacegroup | P21/c (No. 14) |
| unit cell | a = 5.9728(3) Å |
|  | b = 7.5088(4) Å |
|  | c = 59.104(3) Å |
|  | a = 90° |
|  | b = 90.267(5)° |
|  | g = 90° |
| cell volume, V | 2650.7(2) Å$^3$ |
| cell formula unit, Z | 4 |
| density, $r_{calcd}$ | 1.521 g/cm$^3$ |
| abs. coeff., m | 0.389 mm$^{-1}$ |
| cryst. color and habit | yellow block |
| temp. | 133(2) K |
| radiation, l | Mo Kα, 0.7173 Å |
| min and max, q | 2.067, 27.484° |
| reflns collected | 14584 |
| independent refrections | 5467 |
| data/parameters/restraints | 5467/379/0 |
| R[$F_0 > 4s(F_0)$] | $R_1$ = 0.0628 |
|  | $wR_2$ = 0.1497 |
| GOF on $F^2$ | 1.013 |
| max and min residual densities | 0.612, −0.535 e · Å$^3$ |

Table 3 indicates that an R1 factor obtained as a result of structural optimization is 6.28%. This indicates that it is possible to analyze the structure of the compound represented by the formula (1-1) without any problem.

FIG. 18 indicates that the compound represented by the formula (1-1) has a molecular arrangement referred as herringbone. In the a axis direction, there are an interaction and π-π stacking caused by the overlapping π-electrons of the skeleton of the compound represented by the formula (1-1). In the b axis direction, there is a CH-π interaction caused by the interaction between the hydrogen atoms of the skeleton of the compound represented by the formula (1-1) and the π-electrons of the skeleton. The presence of these interactions causes the compound represented by the formula (1-1) to form a molecular arrangement referred to as herringbone.

As the simulation result of FIG. 19, intense diffraction peaks were confirmed at the three of 19.03°, 23.67°, and 28.09° in a case where CuKα was used as an X-ray source. These three respective diffraction peaks correspond to the diffraction peaks from the plane orientation (111), (020), and (121). All of these diffraction peaks are peaks indicating the formation of a herringbone structure. It has been thus found that, in a case of the thin film and the ternary thin film, the compound represented by the formula (1-1) has a herringbone structure in each of the films.

In addition, with respect to the photoelectric conversion element, a hole transporting material having a herringbone structure in the organic photoelectric conversion layer causes molecules to be located at spatially closer positions than those of a randomly dispersed hole transporting material. This makes it expectable to increase the electric charge transporting property in the organic photoelectric conversion layer.

Experiment 4: Evaluation of Electric Characteristics

Next, a device sample for evaluating electric characteristics was fabricated by using the following method and the dark current characteristics and external quantum efficiency (EQE) thereof were evaluated.

First, as an experimental example 3-1, an ITO film having a thickness of 100 nm was formed on a quartz glass substrate by using a sputtering device. This ITO film was patterned by photolithography and etching and used as an ITO electrode. Subsequently, the quartz glass substrate provided with the ITO electrode was cleaned in UV/ozone treatment and the quartz glass substrate was then moved to a vacuum evaporation device. A film of the electron blocking material represented by the following formula (7) was formed at an evaporation speed of 1 Å/sec by using a resistive heating method to have a thickness of 5 nm and form an electron block layer while a substrate holder was rotated under a reduced pressure condition of $1 \times 10^{-5}$ Pa or less. Next, as an organic photoelectric conversion layer, films of a $C_{60}$ fullerene (formula (3) described above), the subphthalocyanine (SubPc) represented by the following formula (6), and the compound represented by the following formula (1-1) were formed at a substrate temperature of 20° C. at respective film formation rates of 0.025 nm/second, 0.050 nm/second, and 0.050 nm/second to offer 230 nm as the thickness of the mixture layer. This offered an organic photoelectric conversion layer having a composition ratio of 20 vol % ($C_{60}$ fullerene):40 vol % (SubPc):40 vol % (formula (1-1)). Subsequently, a film of the hole blocking material represented by the following formula (8) was formed at an evaporation speed of 0.3 Å/sec to have a thickness of 5 nm and form a hole block layer Finally, an AlSiCu film was formed on the hole block layer in an evaporation method to have a film thickness of 100 nm and this was used as an upper electrode. A photoelectric conversion element (experimental example 3-1) including a photoelectric conversion region of 1 mm×1 mm was fabricated in the fabricating method described above.

[Chem. 8]

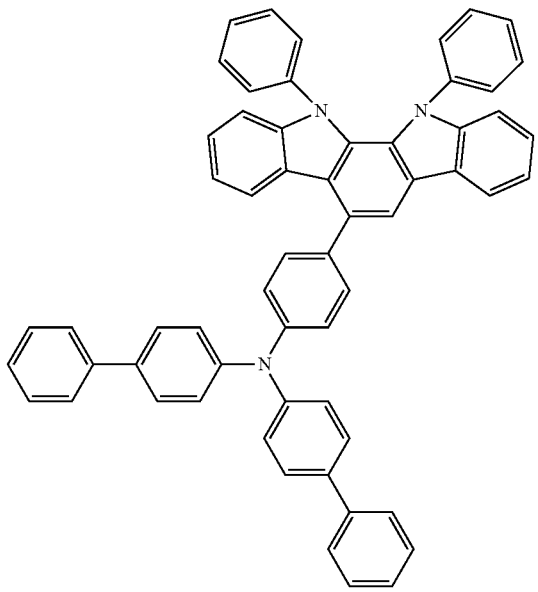

(7)

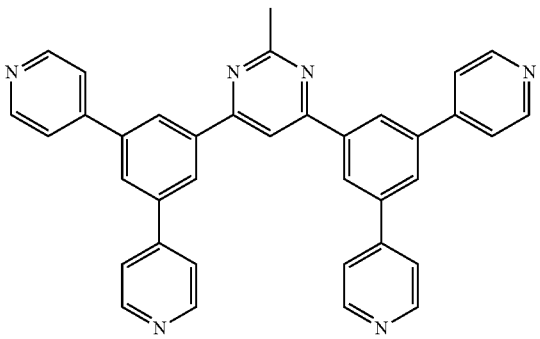

(8)

In addition, as an experimental example 3-2, the compound (rBDT) represented by the formula (5) was used as a hole transporting material in place of the compound represented by the formula (1-1) to fabricate a photoelectric conversion element (experimental example 3-2) by using a method similar to that of the experimental example 3-1.

The EQE and the dark current characteristics were evaluated by using a semiconductor parameter analyzer. Specifically, specifically, a current value (light current value) obtained in a case where a photoelectric conversion element was irradiated with an amount of light corresponding to 1.62 $\mu W/cm^2$ from a light source through a filter and a bias voltage of −2.6 V was applied between electrodes and a current value (dark current value) obtained in a case where the amount of light was set to 0 $\mu W/cm^2$ were each measured. The EQE and the dark current characteristics were calculated from these values. As the wavelength of the light with which the element was irradiated, the wavelength corresponding to the maximum absorption wavelength of each organic photoelectric conversion layer in the visible range was selected. The selected irradiation wavelength of light was 560 nm in any of the experimental example 3-1 and the experimental example 3-2.

Table 4 tabulates the EQE and the dark current characteristics of the experimental example 3-1 and the experimental example 3-2. The numerical values of the experimental example 3-1 are relative values in a case where the experimental example 3-2 is used as a reference (1.0). A result thereof indicates that the experimental example 3-1 has EQE equivalent to that of the experimental example 3-2 and more favorable dark current characteristics than those of the experimental example 3-2. This indicates that the use of the compound represented by the formula (1-1) as a material included in the organic photoelectric conversion layer offers favorable EQE and dark current characteristics.

TABLE 4

|  | quantum efficiency | dark current |
|---|---|---|
| experimental example 3-1 | 1.0 | 0.6 |
| experimental example 3-2 | 1.0 | 1.0 |

In addition, a result of the experiment 1 indicates that the organic photoelectric conversion layer of the experimental example 3-1 is able to absorb the wavelength of a wide region. These results indicate that the use of the compound represented by the general formula (1) or the general formula (2) as a material included in the organic photoelectric conversion layer makes it possible to fabricate a photoelectric conversion element that has excellent electric characteristics and has high light absorption ability.

Although the description has been given with reference to the embodiment, the modification examples 1 to 3, the working examples, the application examples, and the practical application examples, the contents of the present disclosure are not limited to the embodiment and the like described above. The present disclosure may be modified in a variety of ways. For example, the components, disposition, numbers, and the like of the photoelectric conversion elements 10A or the like exemplified in the embodiment and the like described above are merely examples. Not all of the components have to be provided. In addition, other components may be further included.

In the embodiment and the like described above, the example has been described in which the organic photoelectric conversion section 20 that detects the visible light region and the inorganic photoelectric conversion section 32 that detects light in the infrared light region are stacked, but it is also possible to use the organic photoelectric conversion section 20 alone.

In addition, in the embodiment and the like described above, the example has been described in which the lower electrode 21 includes one electrode, but two or three or more electrodes may be used. Further, the present technology has been described in the embodiment and the like described above with reference to a so-called back-illuminated image sensor as an example in which the front (second surface 30B) side of the semiconductor substrate 30 is provided with the multilayer wiring layer 40 and light comes from the back surface (first surface 30A) side, but the present technology is also applicable to a front-illuminated image sensor.

Still further, in the modification example 2 described above, the example has been described in which the red light (R) and the green light (G) are detected in the semiconductor substrate 30 and the blue light (B) is detected above this semiconductor substrate 30 as the photoelectric conversion element 10D that detects the visible light region, but this is not limitative. For example, the red light (R) may be detected in the semiconductor substrate 30 and there may be provided two respective organic photoelectric conversion sections that detect the green light (G) and the blue light (B) above this semiconductor substrate 30.

It is to be noted that the effects described herein are merely examples, but are not limitative. In addition, there may be other effects.

It is to be noted that the present disclosure may also have configurations as follows. According to the present technology having the following configurations, the photoelectric conversion layer is formed by using the hole transporting material that absorbs blue light as the first organic semiconductor material. This makes it possible to extend the absorption spectrum of the photoelectric conversion layer and provide a photoelectric conversion element and an imaging device each having a wide absorption spectrum.

[1]
A photoelectric conversion element including:
a first electrode;
a second electrode that is disposed to be opposed to the first electrode; and
a photoelectric conversion layer that is provided between the first electrode and the second electrode, the photoelectric conversion layer including a hole transporting material as a first organic semiconductor material, the hole transporting material absorbing blue light.

[2]
The photoelectric conversion element according to [1], in which
the photoelectric conversion layer includes a plurality of organic semiconductor materials each having a different absorption maximum wavelength, and
an absorption maximum wavelength of the hole transporting material is shortest among the plurality of organic semiconductor materials.

[3]
The photoelectric conversion element according to [1] or [2], in which the hole transporting material has crystallizability.

[4]
The photoelectric conversion element according to any of [1] to [3], in which the hole transporting material has a herringbone-type molecular arrangement.

[5]
The photoelectric conversion element according to any of [1] to [4], in which the photoelectric conversion layer further includes a second organic semiconductor material having an absorption maximum wavelength different from an absorption maximum wavelength of the first organic semiconductor material.

[6]
The photoelectric conversion element according to any of [1] to [4], in which the photoelectric conversion layer further includes a third organic semiconductor material having an absorption maximum wavelength different from an absorption maximum wavelength of the first organic semiconductor material.

[7]
The photoelectric conversion element according to any of [1] to [4], in which the photoelectric conversion layer includes a second organic semiconductor material and a third organic semiconductor material, the second organic semiconductor material and the third organic semiconductor material each having an absorption maximum wavelength different from an absorption maximum wavelength of the first organic semiconductor material.

[8]
The photoelectric conversion element according to [7], in which
the first organic semiconductor material, the second organic semiconductor material, and the third organic semiconductor material each have a different absorption maximum wavelength, and
the absorption maximum wavelength of the first organic semiconductor material is shortest.

[9]
The photoelectric conversion element according to any of [5] to [8], in which
the second organic semiconductor material includes a fullerene or a fullerene derivative, and
the first organic semiconductor material has a shallower Highest Occupied Molecular Orbital (HOMO) level than a HOMO level of the second organic semiconductor material.

[10]
The photoelectric conversion element according to any of [1] to [9], in which the hole transporting material includes a dithieno[2,3-d:2',3'-d']benzo[1,2-b:4,5-b']dithiophene derivative represented by the following general formula (1) or general formula (2).

[Chem. 1]

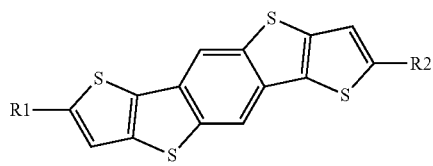

(1)

[Chem. 2]

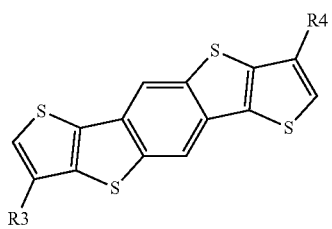

(2)

(R1, R2, R3, and R4 each independently represent a phenyl group, a biphenyl group, a terphenyl group, a naphthalene group, a phenylnaphthalene group, a biphenylnaphthalene group, a binaphthalene group, a thiophene group, a bithiophene group, a terthiophene group, a benzothiophene group, a phenyl benzothiophene group, a biphenyl benzothiophene group a benzofuran group, a phenyl benzofuran group, a biphenyl benzothiophene group, an alkane group, a cycloalkane group, a fluorene group, a phenylfluorene group, a carbazole group, or a derivative thereof.)

[11]
The photoelectric conversion element according to any of [1] to [9], in which the hole transporting material includes compounds represented by the following formula (1-1) to formula (1-5).

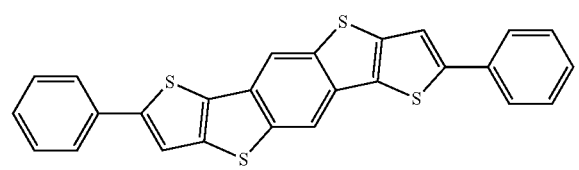
(1-1)

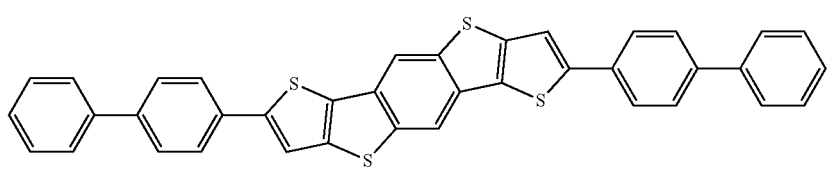
(1-2)

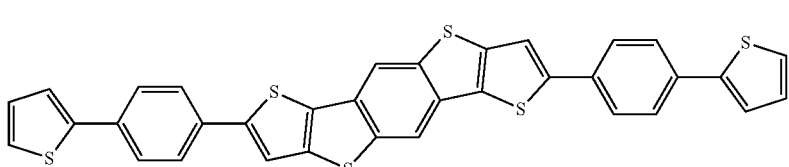
(1-3)

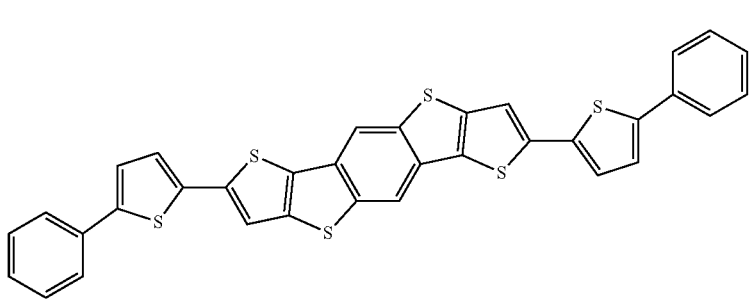
(1-4)

-continued (1-5)

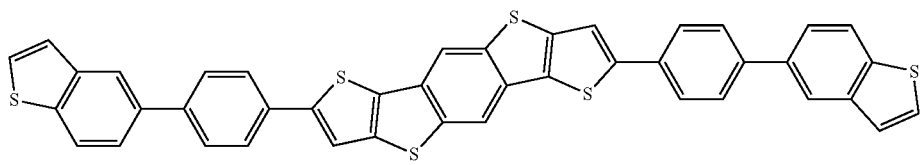

[12]
An imaging device including
a plurality of pixels that is each provided with photoelectric conversion elements as one or more organic photoelectric conversion sections, in which
the photoelectric conversion elements each include
a first electrode,
a second electrode that is disposed to be opposed to the first electrode, and
a photoelectric conversion layer that is provided between the first electrode and the second electrode, the photoelectric conversion layer including a hole transporting material as a first organic semiconductor material, the hole transporting material absorbing blue light.

[13]
The imaging device according to [12], in which the one or more organic photoelectric conversion sections and one or more inorganic photoelectric conversion sections are stacked in each of the pixels, the one or more inorganic photoelectric conversion sections each performing photoelectric conversion in a wavelength range different from a wavelength range of each of the organic photoelectric conversion sections.

[14]
The imaging device according to [13], in which
the inorganic photoelectric conversion sections are formed to be buried in a semiconductor substrate, and
the organic photoelectric conversion sections are formed on a first surface side of the semiconductor substrate.

[15]
The imaging device according to [14], in which the semiconductor substrate has a second surface opposed to the first surface and has a multilayer wiring layer formed on the second surface side.

[16]
The imaging device according to any of [13] to [15], in which
the organic photoelectric conversion sections each perform photoelectric conversion in a visible light region, and
the inorganic photoelectric conversion sections each perform photoelectric conversion in an infrared light region.

[17]
The imaging device according to any of [12] to [16], in which a plurality of the organic photoelectric conversion sections is stacked in each of the pixels, the plurality of the organic photoelectric conversion sections each performing photoelectric conversion in a different wavelength range.

This application claims the priority on the basis of Japanese Patent Application No. 2019-200097 filed with Japan Patent Office on Nov. 1, 2019, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A photoelectric conversion element comprising:
a first electrode;
a second electrode that is disposed to be opposed to the first electrode; and
a photoelectric conversion layer that is provided between the first electrode and the second electrode, the photoelectric conversion layer including a hole transporting material as a first organic semiconductor material, the hole transporting material absorbing blue light,
wherein the hole transporting material includes a dithieno [2,3-d: 2',3'-d'] benzo [1,2-b: 4,5-b']dithiophene derivative represented by a general formula (1) or a general formula (2) as follows:

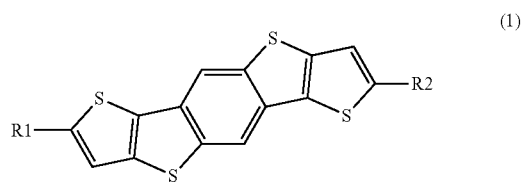

(1)

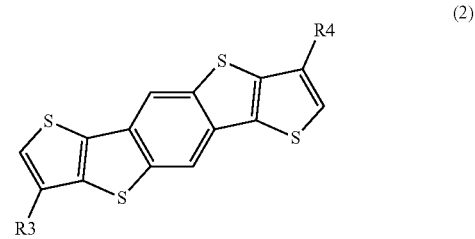

(2)

where R1, R2, R3, and R4 each independently represent a phenyl group, a biphenyl group, a terphenyl group, a naphthalene group, a phenylnaphthalene group, a biphenylnaphthalene group, a binaphthalene group, a thiophene group, a bithiophene group, a terthiophene group, a benzothiophene group, a phenyl benzothiophene group, a biphenyl benzothiophene group a benzofuran group, a phenyl benzofuran group, a biphenyl benzothiophene group, an alkane group, a cycloalkane group, a fluorene group, a phenylfluorene group, a carbazole group, or a derivative thereof.

2. The photoelectric conversion element according to claim 1, wherein
the photoelectric conversion layer includes a plurality of organic semiconductor materials each having a different absorption maximum wavelength, and
an absorption maximum wavelength of the hole transporting material is shortest among the plurality of organic semiconductor materials.

3. The photoelectric conversion element according to claim 1, wherein the hole transporting material has crystallizability.

4. The photoelectric conversion element according to claim 1, wherein the hole transporting material has a herringbone-type molecular arrangement.

5. The photoelectric conversion element according to claim 1, wherein the photoelectric conversion layer further includes a second organic semiconductor material having an absorption maximum wavelength different from an absorption maximum wavelength of the first organic semiconductor material.

6. The photoelectric conversion element according to claim 5, wherein
the second organic semiconductor material includes a fullerene or a fullerene derivative, and
the first organic semiconductor material has a shallower Highest Occupied Molecular Orbital (HOMO) level than a HOMO level of the second organic semiconductor material.

7. The photoelectric conversion element according to claim 1, wherein the photoelectric conversion layer further includes a third organic semiconductor material having an absorption maximum wavelength different from an absorption maximum wavelength of the first organic semiconductor material.

8. The photoelectric conversion element according to claim 1, wherein the photoelectric conversion layer includes a second organic semiconductor material and a third organic semiconductor material, the second organic semiconductor material and the third organic semiconductor material each having an absorption maximum wavelength different from an absorption maximum wavelength of the first organic semiconductor material.

9. The photoelectric conversion element according to claim 8, wherein
the first organic semiconductor material, the second organic semiconductor material, and the third organic semiconductor material each have a different absorption maximum wavelength, and
the absorption maximum wavelength of the first organic semiconductor material is shortest.

10. The photoelectric conversion element according to claim 1, wherein the dithieno [2,3-d: 2',3'-d'] benzo [1,2-b: 4,5-b'] dithiophene derivative includes compounds represented by formula (1-1) to formula (1-5) as follows:

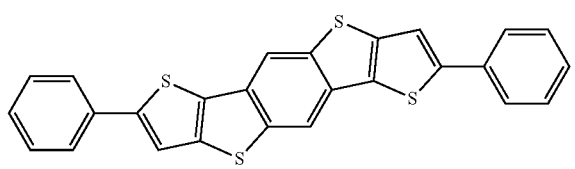

(1-1)

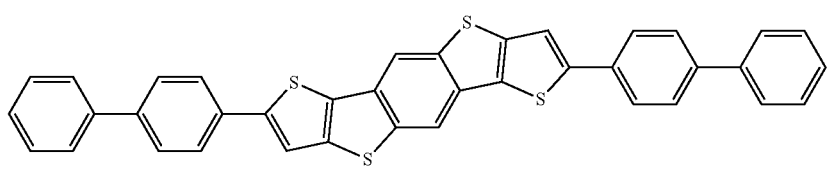

(1-2)

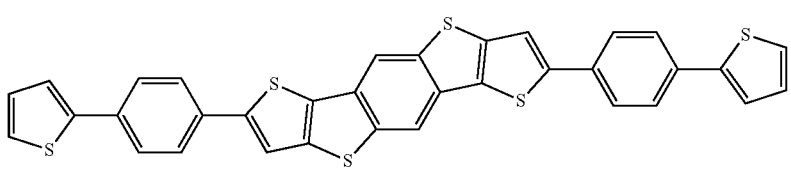

(1-3)

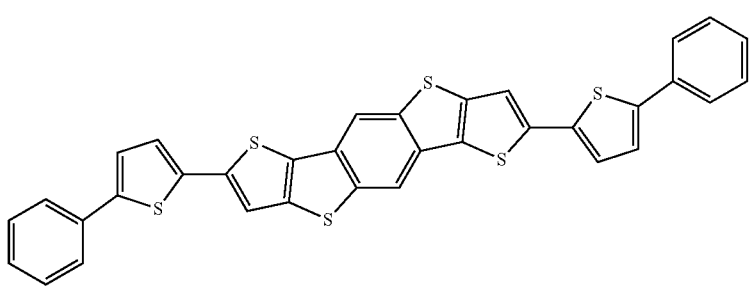

(1-4)

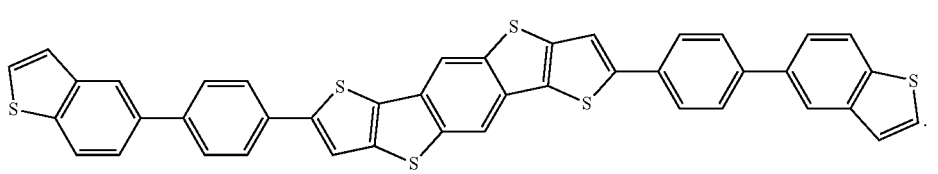

(1-5)

11. An imaging device comprising
a plurality of pixels that is each provided with photoelectric conversion elements as one or more organic photoelectric conversion sections, wherein
the photoelectric conversion elements each include a first electrode,
a second electrode that is disposed to be opposed to the first electrode, and
a photoelectric conversion layer that is provided between the first electrode and the second electrode, the photoelectric conversion layer including a hole transporting material as a first organic semiconductor material, the hole transporting material absorbing blue light,
wherein the hole transporting material includes a dithieno [2,3-d: 2',3'-d'] benzo [1,2-b: 4,5-b'ldithiophene derivative represented by a general formula (1) or a general formula (2) as follows:

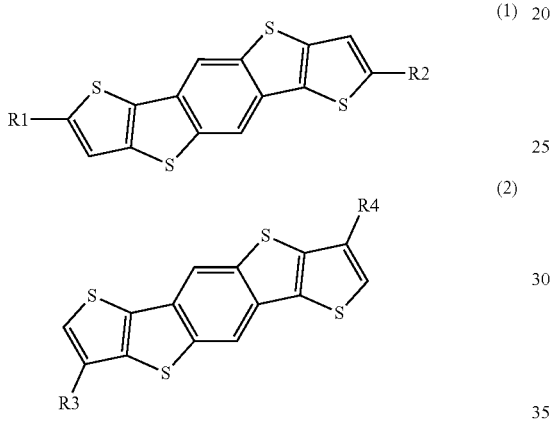

(1)

(2)

where R1, R2, R3, and R4 each independently represent a phenyl group, a biphenyl group, a terphenyl group, a naphthalene group, a phenylnaphthalene group, a biphenylnaphthalene group, a binaphthalene group, a thiophene group, a bithiophene group, a terthiophene group, a benzothiophene group, a phenyl benzothiophene group, a biphenyl benzothiophene group a benzofuran group, a phenyl benzofuran group, a biphenyl benzothiophene group, an alkane group, a cycloalkane group, a fluorene group, a phenylfluorene group, a carbazole group, or a derivative thereof.

12. The imaging device according to claim 11, wherein the one or more organic photoelectric conversion sections and one or more inorganic photoelectric conversion sections are stacked in each of the pixels, the one or more inorganic photoelectric conversion sections each performing photoelectric conversion in a wavelength range different from a wavelength range of each of the organic photoelectric conversion sections.

13. The imaging device according to claim 12, wherein
the inorganic photoelectric conversion sections are formed to be buried in a semiconductor substrate, and
the organic photoelectric conversion sections are formed on a first surface side of the semiconductor substrate.

14. The imaging device according to claim 13, wherein the semiconductor substrate has a second surface opposed to the first surface and has a multilayer wiring layer formed on the second surface side.

15. The imaging device according to claim 12, wherein
the organic photoelectric conversion sections each perform photoelectric conversion in a visible light region, and
the inorganic photoelectric conversion sections each perform photoelectric conversion in an infrared light region.

16. The imaging device according to claim 11, wherein a plurality of the organic photoelectric conversion sections is stacked in each of the pixels, the plurality of the organic photoelectric conversion sections each performing photoelectric conversion in a different wavelength range.

17. The imaging device according to claim 11, wherein the dithieno [2,3-d: 2',3'-d'] benzo [1,2-b: 4,5-b'] dithiophene derivative includes compounds represented by formula (1-1) to formula (1-5) as follows:

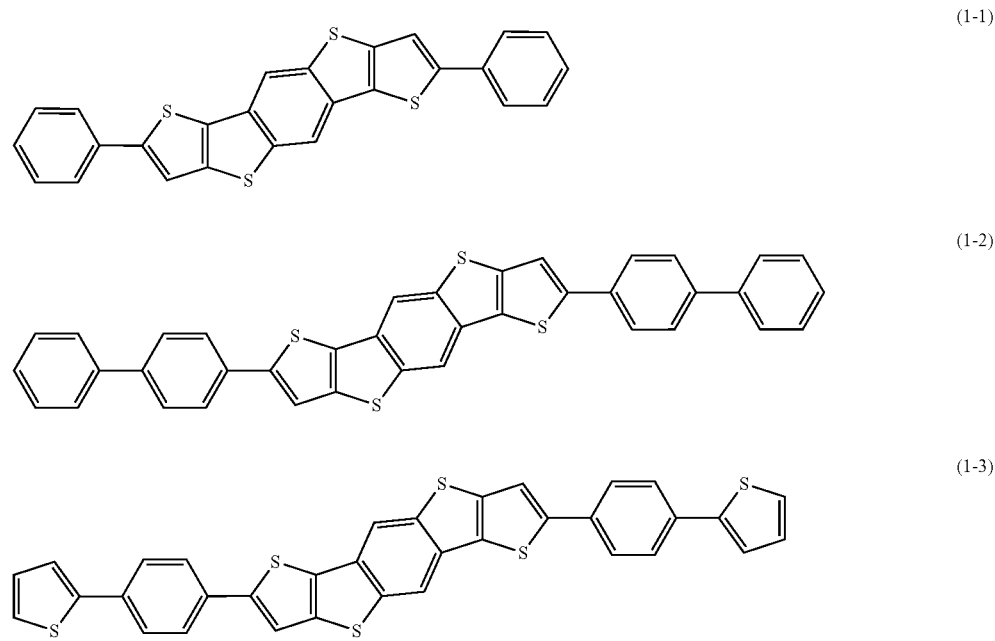

(1-1)

(1-2)

(1-3)

(1-4)
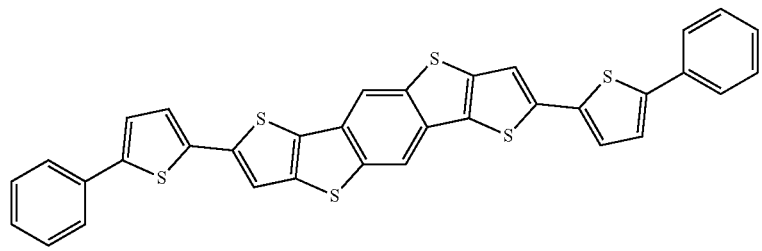
(1-5)
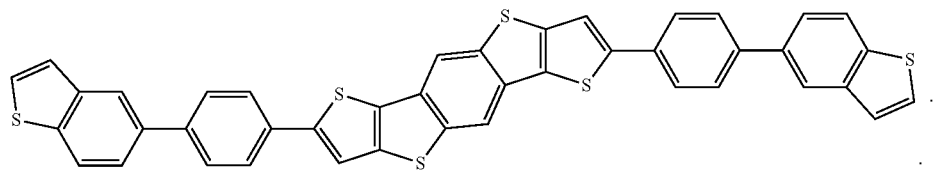
* * * * *